United States Patent
Hanzlik et al.

(10) Patent No.: US 11,476,129 B2
(45) Date of Patent: Oct. 18, 2022

(54) TRANSLATING AND ROTATING CHUCK FOR PROCESSING MICROELECTRONIC SUBSTRATES IN A PROCESS CHAMBER

(71) Applicant: TEL MANUFACTURING AND ENGINEERING OF AMERICA, INC., Chaska, MN (US)

(72) Inventors: Edward Deneen Hanzlik, Shorewood, MN (US); Michael W. Gruenhagen, Norwood Young America, MN (US); Tim W. Herbst, Minneapolis, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 677 days.

(21) Appl. No.: 15/824,021

(22) Filed: Nov. 28, 2017

(65) Prior Publication Data
US 2018/0151396 A1    May 31, 2018

Related U.S. Application Data

(60) Provisional application No. 62/427,754, filed on Nov. 29, 2016.

(51) Int. Cl.
*B08B 7/00* (2006.01)
*H01L 21/02* (2006.01)
(Continued)

(52) U.S. Cl.
CPC ...... *H01L 21/67051* (2013.01); *B08B 7/0092* (2013.01); *H01L 21/02052* (2013.01);
(Continued)

(58) Field of Classification Search
CPC ............ B08B 7/0092; H01L 21/02052; H01L 21/67051; H01L 21/6719; H01L 21/68742; H01L 21/68764; H01L 21/68785
(Continued)

(56) References Cited

U.S. PATENT DOCUMENTS 3,538,883 A    11/1970  Polin
5,270,600 A    12/1993  Hashimoto
(Continued)

FOREIGN PATENT DOCUMENTS

CN    105314343 A    2/2016
JP    1987173718 A    7/1987
(Continued)

OTHER PUBLICATIONS

PCT/US2019/018405 PCT International Search Report, dated May 6, 2019, 2018, 3 pgs.
(Continued)

*Primary Examiner* — Levon J Shahinian
(74) *Attorney, Agent, or Firm* — Kagan Binder, PLLC

(57) ABSTRACT

Cleaning systems and methods for semiconductor fabrication use rotatable and translatable chuck assemblies that incorporate a compact drive system to cause chuck rotation. The system uses an offset drive gear that drives a ring gear. This reduces components whose friction or lubricants might generate undue contamination. The low friction chuck functionality of the present invention is useful in any fabrication tool in which a workpiece is supported on a rotating support during a treatment. The chuck is particularly useful in cryogenic cleaning treatments.

30 Claims, 16 Drawing Sheets

(51) Int. Cl.
*H01L 21/67* (2006.01)
*H01L 21/687* (2006.01)

(52) U.S. Cl.
CPC .... *H01L 21/6719* (2013.01); *H01L 21/68742* (2013.01); *H01L 21/68764* (2013.01); *H01L 21/68785* (2013.01)

(58) Field of Classification Search
USPC .................. 134/105, 149, 153, 157, 902
See application file for complete search history.

(56) References Cited

U.S. PATENT DOCUMENTS

| | | |
|---|---|---|
| 5,554,964 A | 9/1996 | Jansseune |
| 5,598,974 A | 2/1997 | Lewis et al. |
| 5,730,803 A | 3/1998 | Steger et al. |
| 5,818,137 A | 10/1998 | Nichols |
| 5,820,104 A | 10/1998 | Koyano et al. |
| 5,887,605 A | 3/1999 | Lee et al. |
| 5,961,732 A | 10/1999 | Patrin et al. |
| 5,965,047 A | 10/1999 | Blersch et al. |
| 6,136,163 A | 10/2000 | Cheung et al. |
| 6,146,463 A | 11/2000 | Yudovsky et al. |
| 6,168,665 B1 | 1/2001 | Sakai et al. |
| 6,217,423 B1 | 4/2001 | Ohmori et al. |
| 6,241,577 B1 | 6/2001 | Shibata |
| 6,290,569 B1 | 9/2001 | Mizuno et al. |
| 6,435,798 B1 | 8/2002 | Satoh |
| 6,800,833 B2 | 10/2004 | Gregor et al. |
| 7,332,691 B2 | 2/2008 | Choi et al. |
| 7,860,379 B2 | 12/2010 | Hunter et al. |
| 8,314,371 B2 | 11/2012 | Sorabji |
| 8,844,546 B2 | 9/2014 | Chen et al. |
| 9,564,378 B2 | 2/2017 | Rose et al. |
| 9,689,507 B2 | 6/2017 | Taguchi |
| 9,837,260 B2 | 12/2017 | Inai et al. |
| 10,012,316 B2 | 7/2018 | Taguchi et al. |
| 10,418,270 B2 | 9/2019 | Hanzlik et al. |
| 10,468,277 B2 | 11/2019 | Schoeb |
| 10,843,236 B2 | 11/2020 | Butterbaugh |
| 10,910,253 B2 | 2/2021 | Inhofer et al. |
| 10,991,610 B2 | 4/2021 | Butterbaugh et al. |
| 11,020,774 B2 | 6/2021 | Mbanaso |
| 11,035,488 B2 | 6/2021 | Kozaki |
| 11,268,630 B2 | 3/2022 | Hosek |
| 2002/0017237 A1 | 2/2002 | Wirth et al. |
| 2002/0157686 A1 | 10/2002 | Kenny et al. |
| 2003/0015141 A1 | 1/2003 | Takagi |
| 2003/0132746 A1 | 7/2003 | Cox |
| 2003/0156270 A1 | 8/2003 | Hunter |
| 2003/0178145 A1 | 9/2003 | Anderson et al. |
| 2003/0230323 A1 | 12/2003 | You et al. |
| 2004/0004713 A1 | 1/2004 | Go et al. |
| 2004/0005212 A1 | 1/2004 | Wu |
| 2004/0146367 A1 | 8/2004 | Ko et al. |
| 2004/0163670 A1 | 8/2004 | Ko et al. |
| 2004/0221877 A1 | 11/2004 | Bergman |
| 2005/0031497 A1 | 2/2005 | Siebert et al. |
| 2005/0127927 A1 | 6/2005 | Harris et al. |
| 2006/0039781 A1 | 2/2006 | Niewmierzycki et al. |
| 2006/0162739 A1 | 7/2006 | Sogard |
| 2006/0182528 A1 | 8/2006 | Fan et al. |
| 2007/0209684 A1 | 9/2007 | Chen et al. |
| 2007/0247778 A1 | 10/2007 | Harb et al. |
| 2008/0056857 A1 | 3/2008 | Hiroki |
| 2008/0099090 A1 | 5/2008 | Cook |
| 2008/0229811 A1 | 9/2008 | Zhao et al. |
| 2008/0280453 A1 | 11/2008 | Koelmel et al. |
| 2009/0114253 A1 | 5/2009 | Matsumoto |
| 2009/0314211 A1 | 12/2009 | Bois et al. |
| 2010/0012856 A1 | 1/2010 | Aoki |
| 2010/0048106 A1 | 2/2010 | Wang et al. |
| 2011/0188974 A1 | 8/2011 | Diamond |
| 2012/0325275 A1 | 12/2012 | Goodman et al. |
| 2013/0062839 A1 | 3/2013 | Tschiderle et al. |
| 2013/0152971 A1 | 6/2013 | Kato |
| 2013/0214497 A1 | 8/2013 | Yoshida |
| 2013/0233356 A1 | 9/2013 | Obweger et al. |
| 2014/0152976 A1 | 6/2014 | VanHoomissen et al. |
| 2014/0166055 A1 | 6/2014 | Huang et al. |
| 2014/0332161 A1 | 11/2014 | Ricci et al. |
| 2015/0052702 A1 | 2/2015 | Dobashi et al. |
| 2015/0187629 A1 | 7/2015 | Obweger et al. |
| 2015/0279708 A1 | 10/2015 | Kobayashi et al. |
| 2016/0064213 A1 | 3/2016 | Sakai et al. |
| 2016/0096207 A1 | 4/2016 | Butterbaugh et al. |
| 2016/0172256 A1 | 6/2016 | Rose et al. |
| 2016/0303617 A1 | 10/2016 | Mbanaso et al. |
| 2017/0338131 A1 | 11/2017 | Amahisa et al. |
| 2017/0341093 A1 | 11/2017 | Hanzlik |
| 2018/0025904 A1 | 1/2018 | DeKraker |
| 2018/0130694 A1 | 5/2018 | Inhofer et al. |
| 2018/0158717 A1 | 6/2018 | Hanzlik et al. |
| 2018/0214915 A1 | 8/2018 | Butterbaugh |
| 2019/0255580 A1 | 8/2019 | Mbanaso |
| 2020/0020566 A1 | 1/2020 | Inhofer et al. |
| 2021/0023591 A1 | 1/2021 | Butterbaugh |
| 2022/0102188 A1 | 3/2022 | Tang |

FOREIGN PATENT DOCUMENTS

| | | |
|---|---|---|
| JP | 1993023542 U | 3/1993 |
| JP | 2001079505 A | 3/2001 |
| JP | 2002086048 A | 3/2002 |
| JP | 2003017547 A | 1/2003 |
| JP | 2003179040 A | 6/2003 |
| JP | 2005098163 A | 4/2005 |
| JP | 2005225621 A | 8/2005 |
| JP | 2006005177 A | 1/2006 |
| JP | 2007123790 A | 5/2007 |
| JP | 2008182228 A | 8/2008 |
| JP | 2008252007 A | 10/2008 |
| JP | 2010514167 A | 4/2010 |
| JP | 2011-216888 A | 10/2011 |
| JP | 2012-21275 A | 11/2012 |
| JP | 2014049605 A | 3/2014 |
| JP | 2015041646 A | 3/2015 |
| JP | 2016-076702 A | 5/2016 |
| JP | 2016076702 A | 5/2016 |
| KR | 100187445 B1 | 4/1999 |
| KR | 20110036915 A | 4/2011 |
| KR | 2016-0041021 A | 4/2016 |
| WO | 2008077048 A3 | 6/2008 |
| WO | 2010054076 A2 | 5/2010 |
| WO | 2014170928 A | 10/2014 |
| WO | 2016/057524 A1 | 4/2016 |

OTHER PUBLICATIONS

PCT/US2017/0695166, PCT International Search Report, dated Mar. 29, 2018, 3 pgs.
PCT/US2014/069557, PCT International Search Report, dated Mar. 3, 2015, 5 pgs.
PCT/US2017/063486, PCT International Search Report, dated Mar. 5, 2018, 3 pgs.
PCT/US2017060543, PCT International Search Report, dated Feb. 20, 2018, 5 pgs.
PCT/US2018/015545, PCT International Search Report, dated May 14, 2018, 4 pgs.
Japanese Patent Application No. 2019-524030, Office Action dated Oct. 14, 2021, non-English and translated, pp. 1-16.
JP 2019-530478, English Translation of Notice of Reason(s) for Rejection, dated Nov. 30, 2021, pp. 1-6.
JP 2019-540660, English Translation of Notice of Reason(s) for Rejection, dated Nov. 9, 2021, pp. 1-6.
JP 2019-528673, English Translation of Notice of Reason(s) for Rejection, dated Dec. 14, 2021, pp. 1-7.
Korean Patent Application No. 10-2019-7025028, Office Action dated May 10, 2022, non-English and translated, pp. 1-16.
Korean Patent Application No. 10-2019-7019429, Office Action dated May 29, 2022, non-English and translated, pp. 1-12.

(56) References Cited

OTHER PUBLICATIONS

Japanese Patent Application No. 2019-524030, Office Action dated May 10, 2022, non-English and translated, pp. 1-16.
Korean Patent Application No. 10-2019-7016273, Office Action dated May 13, 2022, non-English and translated, pp. 1-17.

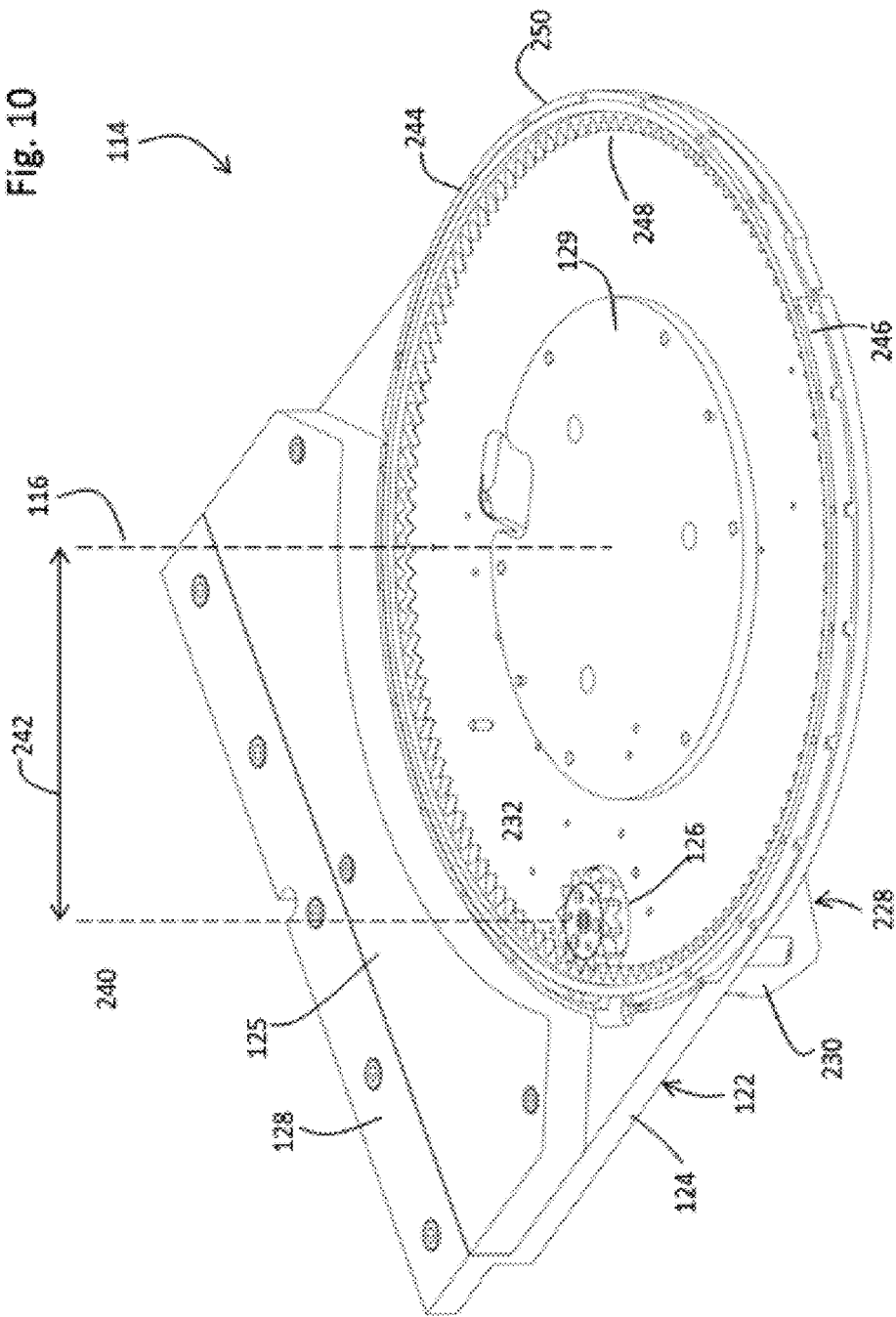

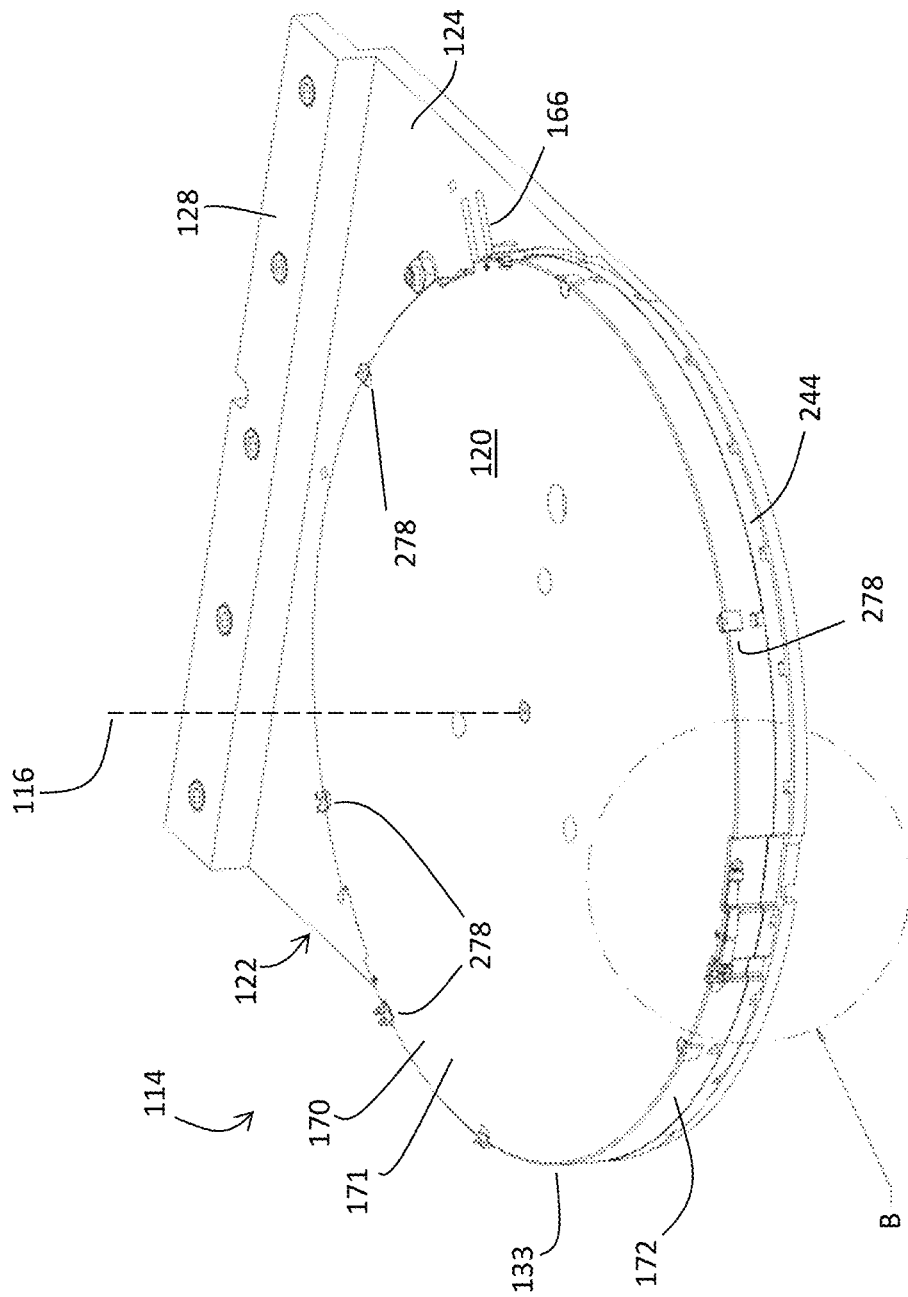

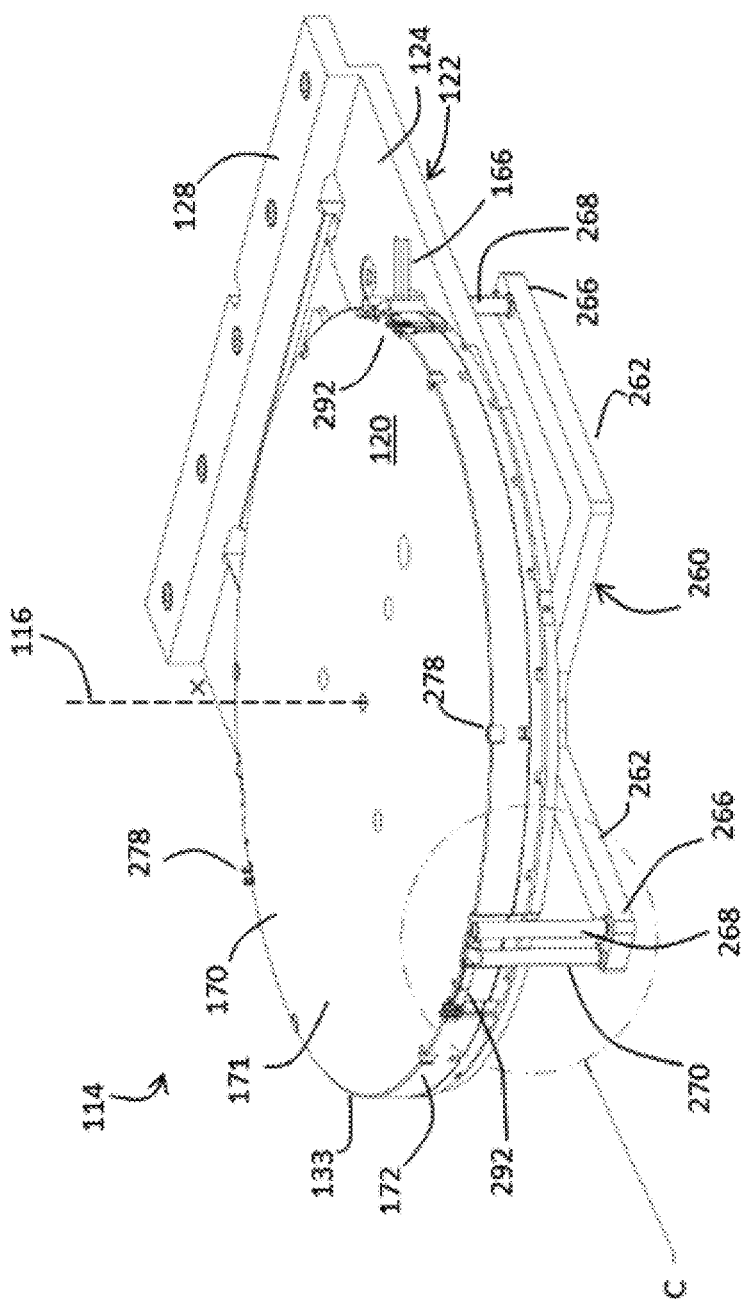

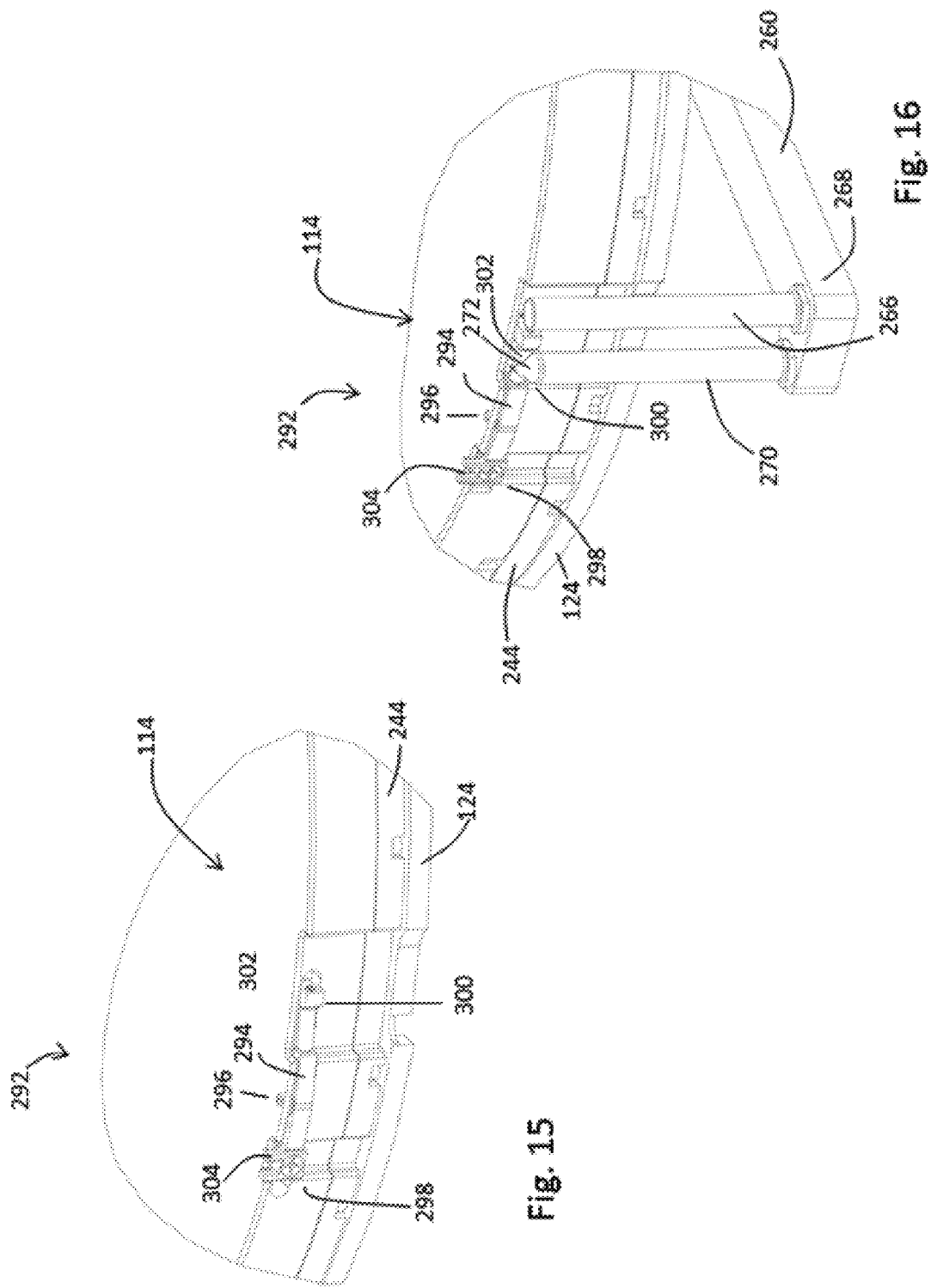

TRANSLATING AND ROTATING CHUCK FOR PROCESSING MICROELECTRONIC SUBSTRATES IN A PROCESS CHAMBER

PRIORITY AND RELATED APPLICATIONS

This application claims priority to U.S. Provisional Patent Application No. 62/427,754 filed Nov. 29, 2016, the contents of which are incorporated herein by reference in their entirety for all purposes.

FIELD OF USE

This disclosure relates to an apparatus and method for treating the surface of a microelectronic substrate, and in particular for cleaning residue, debris, and other materials from a surface of a microelectronic substrate.

BACKGROUND OF THE INVENTION

Advances in microelectronic technology cause integrated circuits (ICs) to be formed on substrates, such as semiconductor substrates, with ever increasing density of active components. The formation of ICs is carried out by sequential application, processing, and selective removal of various materials on the substrate. And, during formation, the exposed surface of the substrate requires cleaning steps to periodically remove process residue and debris. Various compositions have been developed for removal of specific classes of materials from substrates in semiconductor substrate processing, including both dry and wet cleaning technologies. Additionally, several different types of equipment are used to expose substrates to cleaning chemistries under a variety of conditions. An important aspect of this equipment is to achieve high throughput while cleaning the substrate in a uniform manner and minimize any debris or particles being generated by the equipment.

One cleaning strategy known in the microelectronic industry uses streams of particles to remove contaminants from workpiece surfaces. Cryogenic treatments of this type use one or more suitable nozzles to expand a pressurized and cooled fluid (which can be liquid and/or gas and may include some entrained solid material) into a low pressure process chamber. This causes the fluid to generate a treatment stream. The energy of this stream is used to dislodge and remove contaminants from surfaces. Various types of such cryogenic treatment streams are known as cryogenic aerosols, cryogenic aerosol jets, nano-aerosol particles, gas jet clusters, and the like. An excellent example of a cryogenic cleaning tool is available under the trade designation ANTARES® from TEL FSI, Inc., Chaska, Minn., USA.

In a typical cryogenic treatment, the treatment spray is dispensed from at least one nozzle into the processing chamber. A workpiece in the form of a microelectronic substrate is held on a rotatable or translatable chuck. In a rotating configuration, a nozzle would scan a rotating substrate like a record player needle scans a record. However, a scanning nozzle is less practical in a cryogenic tool, because a cryogenic rotary coupling has been difficult to provide in a practical manner. As an alternative to scanning a rotating substrate, a cryogenic tool such as the ANTARES tool have been configured with translating chucks that pass the substrate under a linear nozzle that spans the substrate diameter. The translation or/or rotation of the chuck, in effect, causes the nozzle to treat all or a portion of the substrate surface as desired.

Motors, gears, and other mechanical elements have been used to translate and rotate the chucks that hold the workpieces. The friction between moving components and the lubricants and greases used to assist mechanical function have been a source of contamination on the workpieces. Cleaning treatments tend to be less effective when contamination is generated during the treatment. A significant challenge is to provide chuck designs and corresponding rotational drive systems that can implement chuck rotation for a chuck that also translates through a process chamber. A further challenge is to effectively incorporate heating functionality into such a chuck.

Substrate cleaning equipment has been designed in several ways to achieve efficient and uniform cleaning results while minimizing particles and achieving high throughput. Hence, any improvements to cleaning efficiency (e.g., particle/defect reduction) or uniformity while also improving throughput would be desirable within the industry.

SUMMARY

Disclosed herein are cleaning systems and methods for semiconductor fabrication using rotatable and translatable chuck assemblies that incorporate rotation functionality for the chuck in a manner to reduce risks of contamination from mechanical chuck components. The chuck design is based in part upon using a chuck with both rotating and non-rotating components. A drive gear is used to rotationally drive a ring gear coupled to the rotating chuck components. The drive system is compact, low friction, has a single rotation interface, and shields the rotation interface well inside the chuck to reduce risk of process contamination from the moving parts. Heater functionality is easily incorporated into the non-rotating chuck components to uniformly and effectively heat substrates supported on the chuck. The low friction chuck of the present invention is useful in any fabrication tool in which a workpiece is supported on a rotating support during a treatment. The chuck is particularly useful in cryogenic cleaning treatments.

The chuck design is beneficially incorporated into the ANTARES CX cryogenic tool available from TEL FSI, Inc., Chaska, Minn. Use of the new chuck design in this fabrication tool allows full wafer/substrate cleaning from a solitary fixed overhead nozzle, if desired. Minimum backside contact of a substrate on the chuck is achieved in illustrative embodiments with small contact area raised pads. Pads located at the outer edge were designed with integral outside barriers that provide lateral restraint of the substrate. These barriers are steeply sloped to serve as outer guides to allow easy hand-off of the substrate with the edge lift pins on a lift platform as that platform translates up and down from below the chuck.

Below about 180 slm (standard liters per minute) nozzle flowrate in the Antares CX tool, a substrate tends to stay contained and stable within the boundary of these edge barriers. However, to allow for a nozzle flow rate that exceeds about 180 slm, three of these lateral retention barriers may be replaced with active retention members configured with short extensions that overhang the outer edge of the substrate in order to prevent vertical lift of the substrate. To secure a substrate, these retention barriers are mounted to the ends of actuated pivot arms contained within the thickness of the spin-plate of the chuck. The pivot arms are biased to an overhung position (that does not contact the substrate edge) by compression springs on one end. To free the substrate from such restraint, the pivot arms are actuated by the rolling action of actuation pins on single-roller bearings on the other end. As the chuck rotates into a transfer position, three actuation pins attached to the lift platform and adjacent to the edge lift pins, travel along a vertical path that corresponds with a pivot arm roller-bearing location at the edge of the chuck. As each conical-tipped actuation pin makes contact with each roller bearing, the retention barriers on the opposing side of the pivot arms are pushed outward and thus the substrate is freed to allow the lift platform edge lift pins to lift the substrate. Lowering of the lift platform removes contact of the actuation pins with the roller bearings and thus allows the springs to return the retention barriers to a position that overhangs the edge of a seated substrate.

During a treatment, the chuck may be translated under one or more nozzles in one or several passes at a variety of translation rates, such as at a rate up to 300 mm/sec. Translation may use a preset motion profile that allows uniform coverage of nozzle spray to all substrate areas. Translation and rotation also may occur independently or in any desired sequence.

In one aspect, the present invention relates to an apparatus for treating a microelectronic substrate, comprising
  a) a housing configured to provide a processing chamber in which the microelectronic substrate is subjected to a treatment;
  b) a rotatable and translatable chuck disposed within the processing chamber, wherein the chuck comprises a first chuck portion and a second chuck portion, wherein the second chuck portion rotates independently of the first chuck portion around a central rotation axis, and wherein the second chuck portion holds the microelectronic substrate during at least a portion of the treatment;
  c) a rotational mechanism interconnecting the first and second chuck portions in a manner that allows the second chuck portion to rotate independently of the first chuck portion;
  d) a translation mechanism coupled to the chuck in a manner effective to translate the chuck along a pathway within the process chamber; and
  e) a rotational drive mechanism incorporated into the check in a manner effective to cause rotation of the second chuck portion relative to the first chuck portion, wherein said rotation occurs around the central rotation axis, and wherein said rotational drive mechanism comprises:
    i) a drive gear that rotates about a drive gear axis that is offset radially outward from the central rotation axis of the chuck, and
    iii) a ring gear attached to the second chuck portion, wherein the drive gear engages an inner periphery of the ring gear to rotatably drive the ring gear to impart rotation to the second chuck portion.

In another aspect, the present invention relates to a method for treating a microelectronic substrate, comprising
  a) providing an apparatus comprising a process chamber;
  b) holding a microelectronic substrate on a rotatable chuck in the process chamber, wherein the chuck comprises a first chuck portion and a second chuck portion, wherein the second chuck portion rotates independently of the first chuck portion around a central rotation axis, wherein a rotational drive mechanism is incorporated into the chuck that rotates the second chuck portion independently relative to the first chuck portion, and wherein said rotational drive mechanism comprises:
    i) a drive gear that rotates about a drive gear axis that is offset radially outward from the central rotation axis of the chuck, and
    iii) a ring gear attached to the second chuck portion, wherein the drive gear engages an inner periphery of the ring gear to rotatably drive the ring gear to impart rotation to the second chuck portion; and
  c) using the rotational drive mechanism to cause the second chuck portion on which the substrate is held to rotate during the treatment.

In another aspect, the present invention relates to an apparatus for treating a microelectronic substrate, comprising:
  a) a housing configured to provide a processing chamber in which the microelectronic substrate is subjected to a treatment;
  b) a rotatable chuck disposed within the processing chamber, wherein the chuck holds the microelectronic substrate during at least a portion of the treatment;
  c) a substrate holding system incorporated into the rotatable chuck, said substrate holding system comprising an active substrate retention member, wherein the active substrate member comprises a pivot arm that pivots around an axis, wherein the pivot arm comprises a first end that is actuated to pivot the pivot arm and a second end that comprises a retainer head that helps to retain the substrate on the chuck, wherein the pivot arm is biased to maintain the active substrate retention member to be in a substrate retention configuration, and wherein actuation of the first end of the pivot arm causes the active substrate retention member to pivot to a second configuration that releases retention of the substrate by the active substrate retention member; and
  d) an actuation member that is configured to engage the first end of the pivot arm to cause the active substrate retention member to pivot to the second configuration when the substrate is lifted from the chuck and that allows the active substrate retention member to pivot to the first configuration when the substrate is lowered onto the chuck

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 10 is a perspective view of the base plate used in the chuck of FIGS. 1-9, and further showing how the rotational drive system is deployed relative to the base plate.

FIG. 13 is a perspective view of the chuck included in the apparatus of FIG. 1 showing both stationary retention members and an active retention member for retaining a substrate on the chuck.

FIG. 14 is an alternative perspective view of the chuck shown in FIG. 13, further showing a portion of the lift pin assembly for raising and lowering substrates and for actuating the active retention members.

FIG. 15 is an enlarged view in perspective of the portion of the chuck assembly within dashed circle B of FIG. 13.

FIG. 16 is an enlarged view in perspective of the portion of the chuck assembly within dashed circle C of FIG. 14.

DETAILED DESCRIPTION

Figure 1:
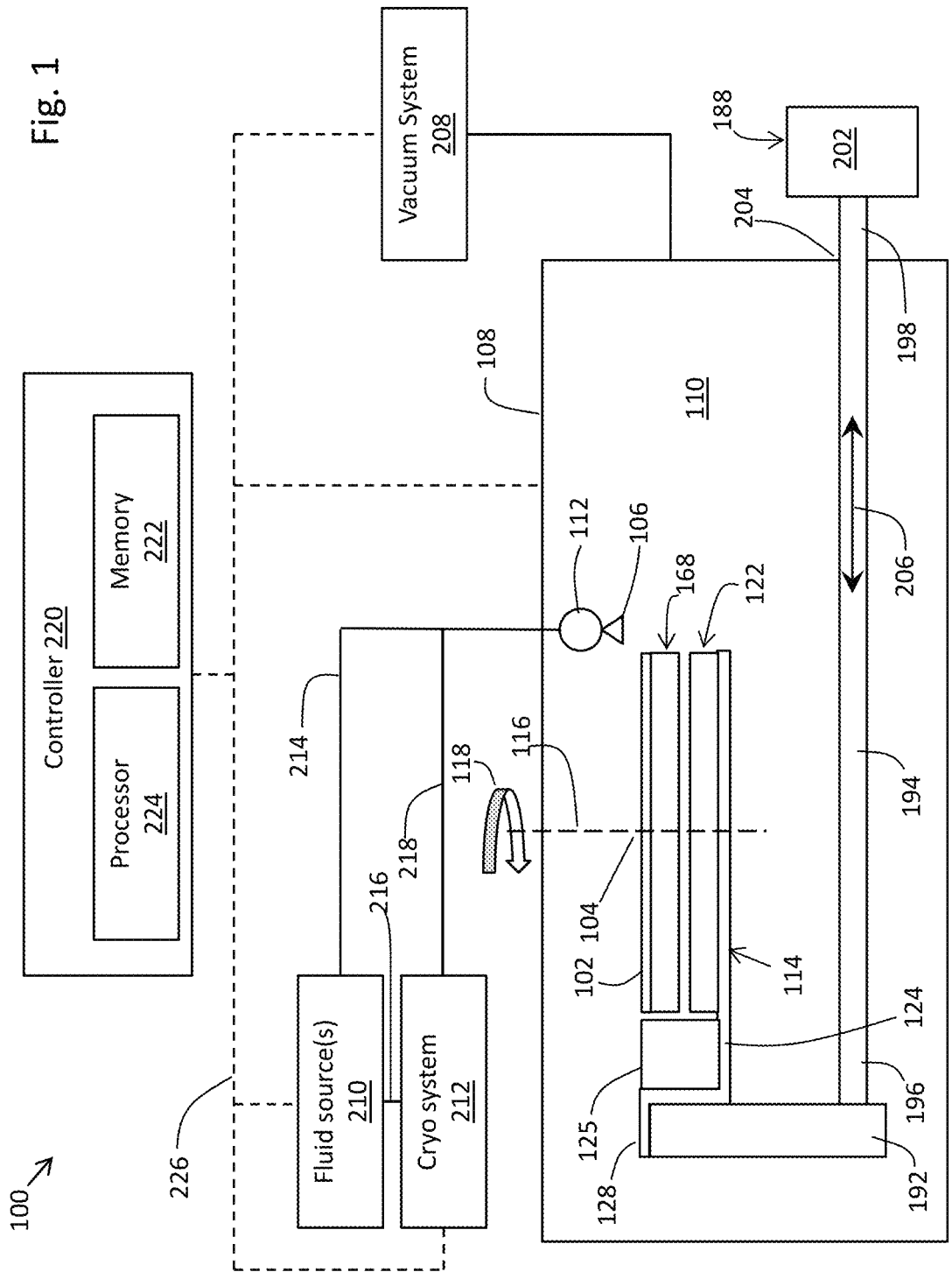
FIG. 1 includes a schematic illustration of an apparatus according to at least one embodiment of the disclosure in the form of a cleaning apparatus that uses a treatment spray to treat a microelectronic substrate, wherein a rotatable and translatable chuck is in a first configuration in which a second chuck portion is rotating relative to a first check portion about a rotation axis while the translation mechanism translates the chuck along a translation path, and wherein the chuck is positioned with the nozzle proximal to an edge of the substrate to begin a treatment (also suitable to end a treatment).
Figure 2:
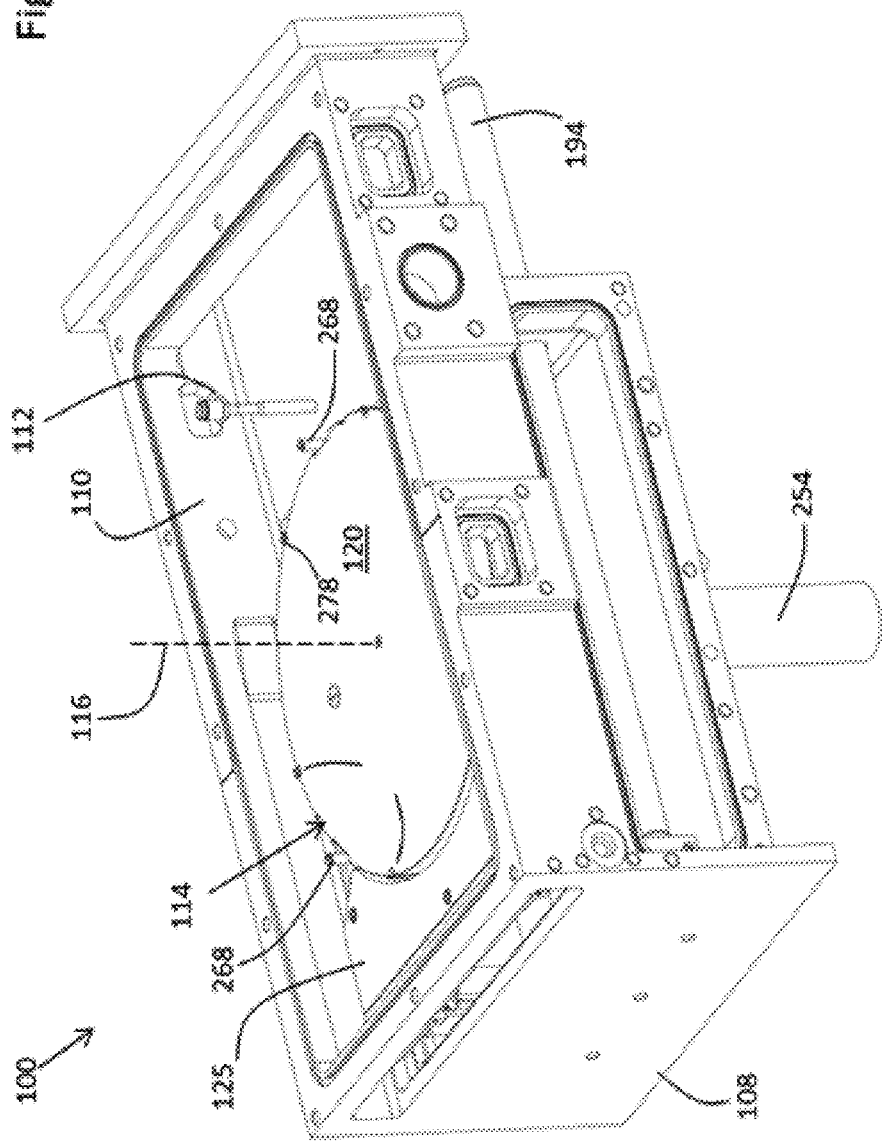
FIG. 2 is a perspective view of a portion of the apparatus of FIG. 1 showing the rotating and translating chuck in a processing chamber.
Figure 3:
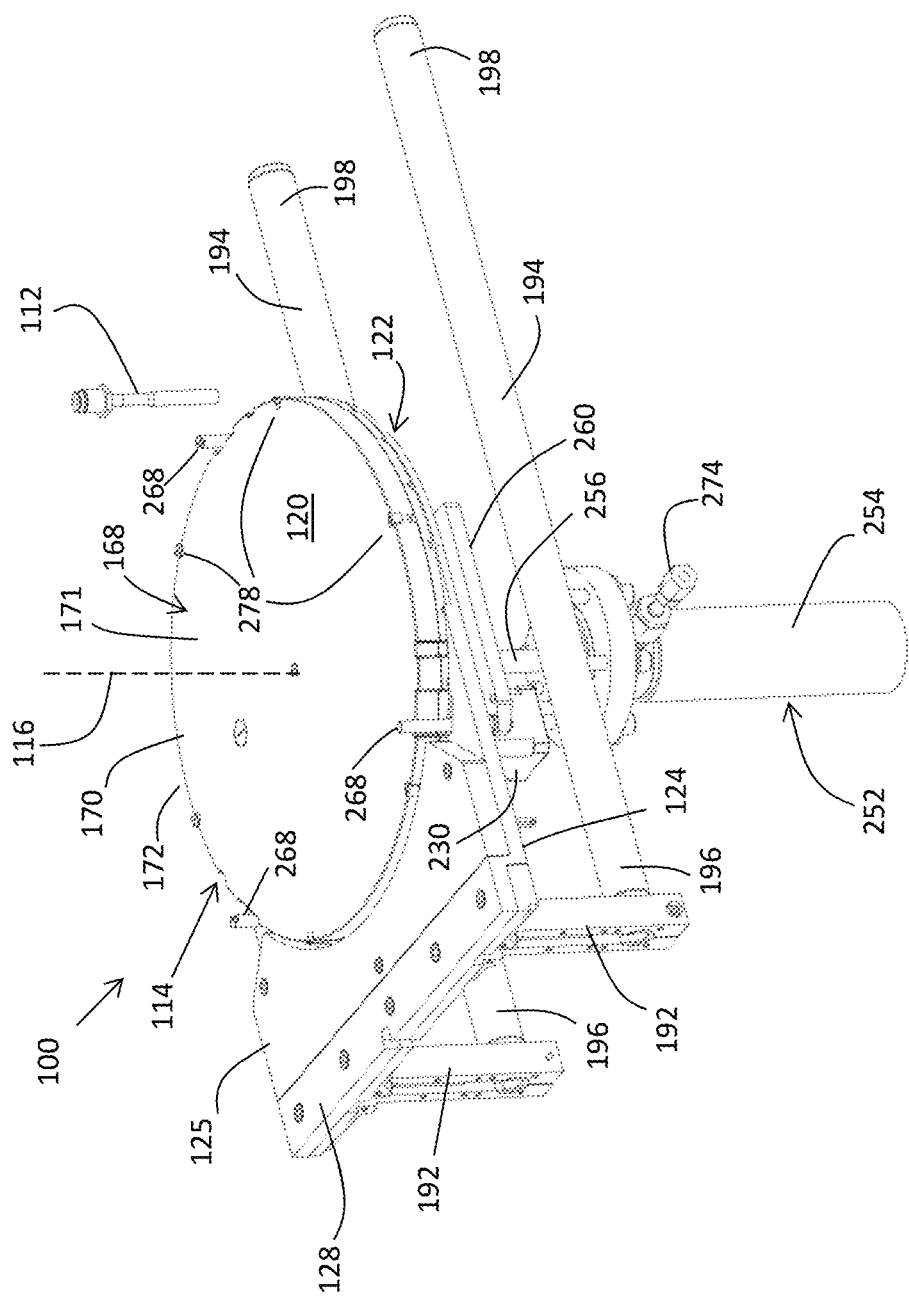
FIG. 3 is a perspective view of a portion of the apparatus of FIG. 2 showing the rotating and translating chuck coupled to a translation mechanism, a rotational drive system, a lift pin system, and a substrate holding system.
Figure 4:
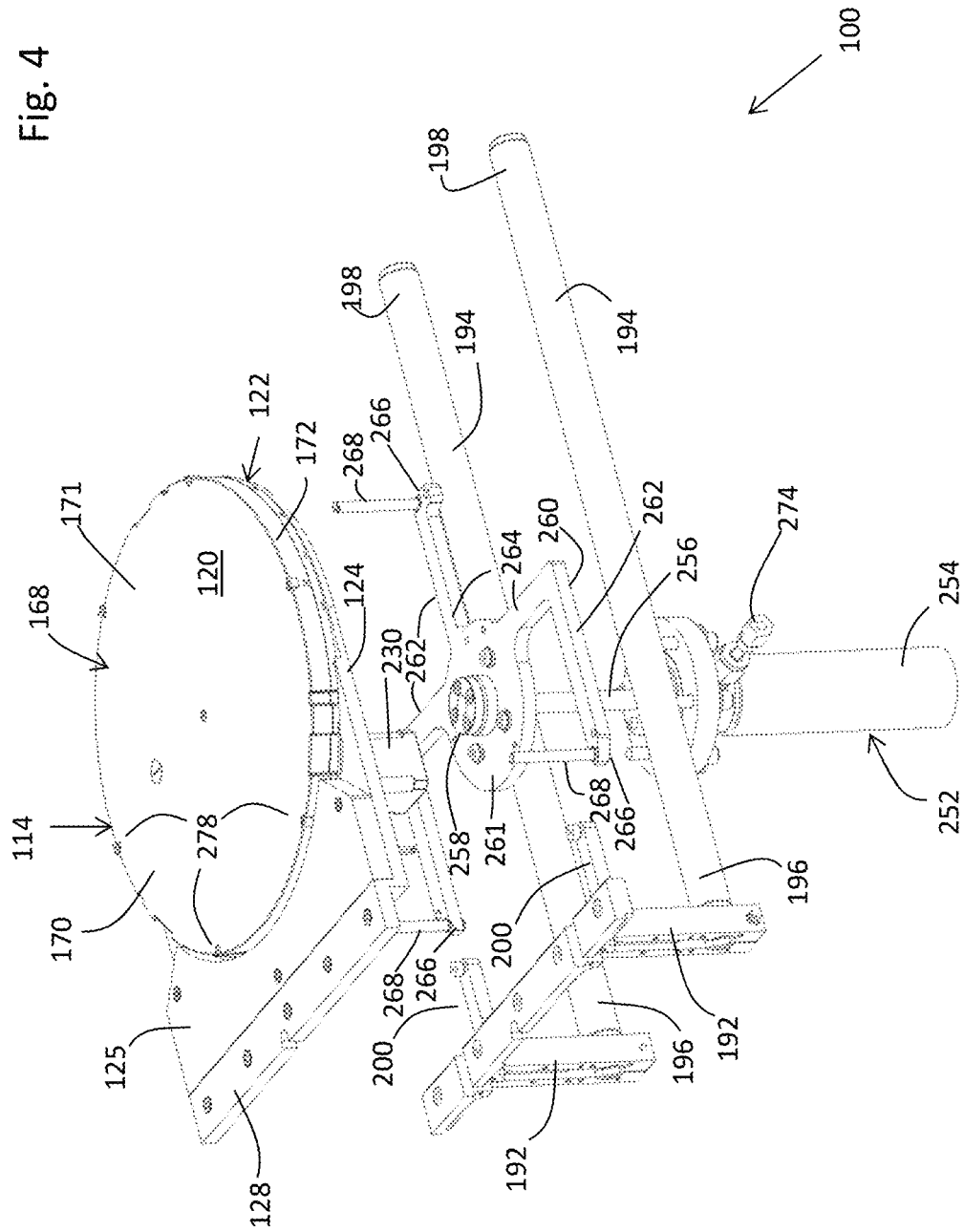
FIG. 4 is an exploded perspective view of the apparatus portion shown in FIG. 3.
Figure 5:
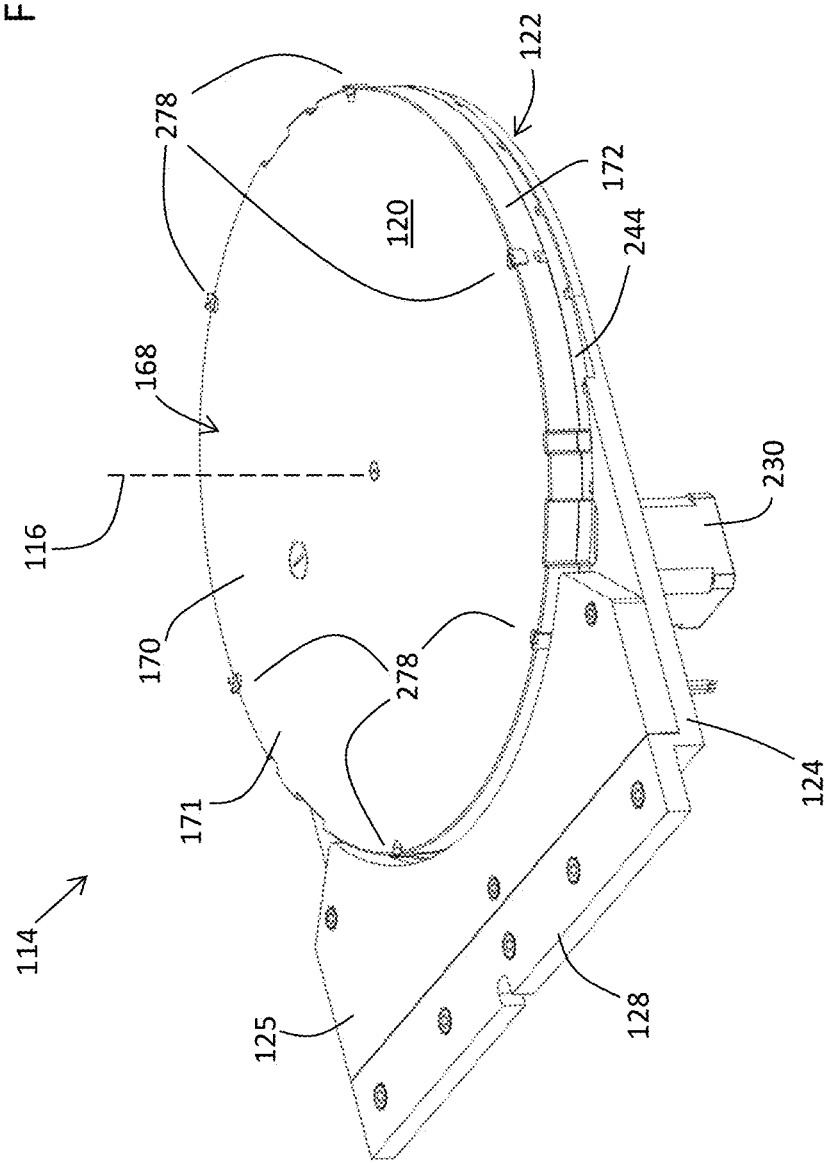
FIG. 5 is a perspective view of the chuck of FIG. 2 in which a portion of the rotational drive system and substrate holding system are also shown.
Figure 6:
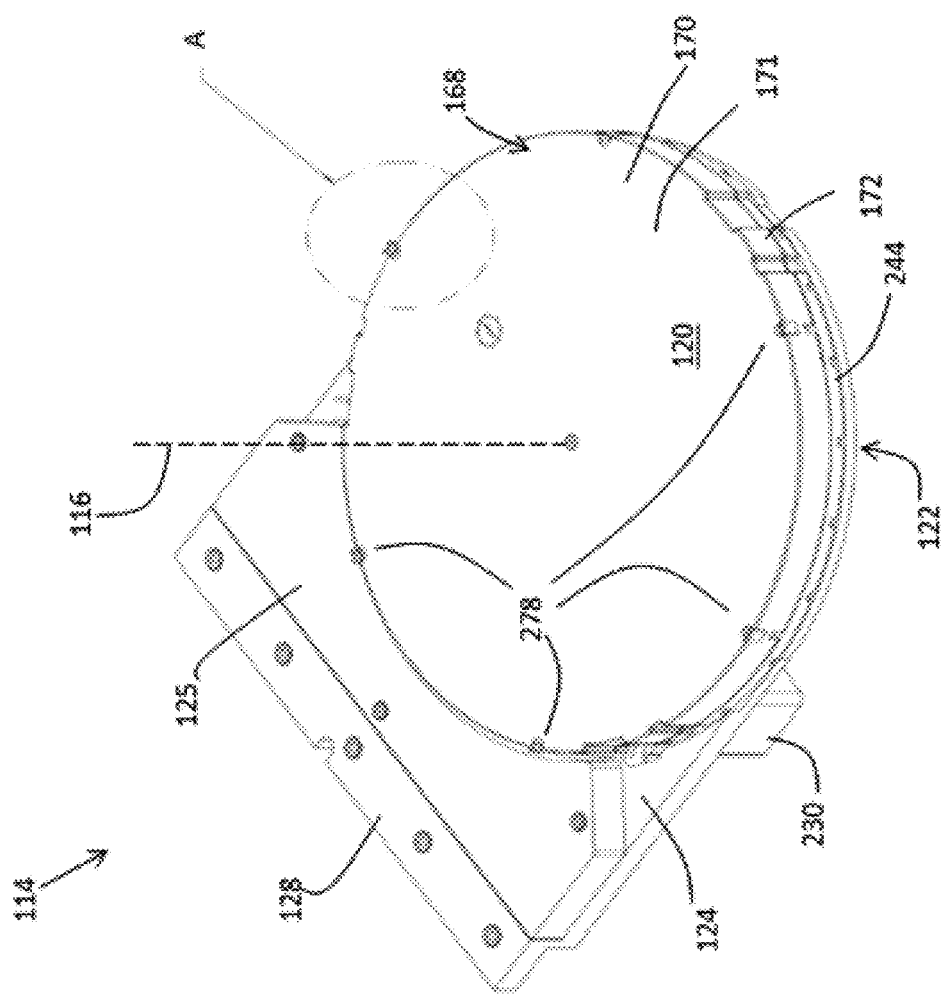
FIG. 6 is an alternative perspective view of the chuck of FIG. 5.
Figure 7:
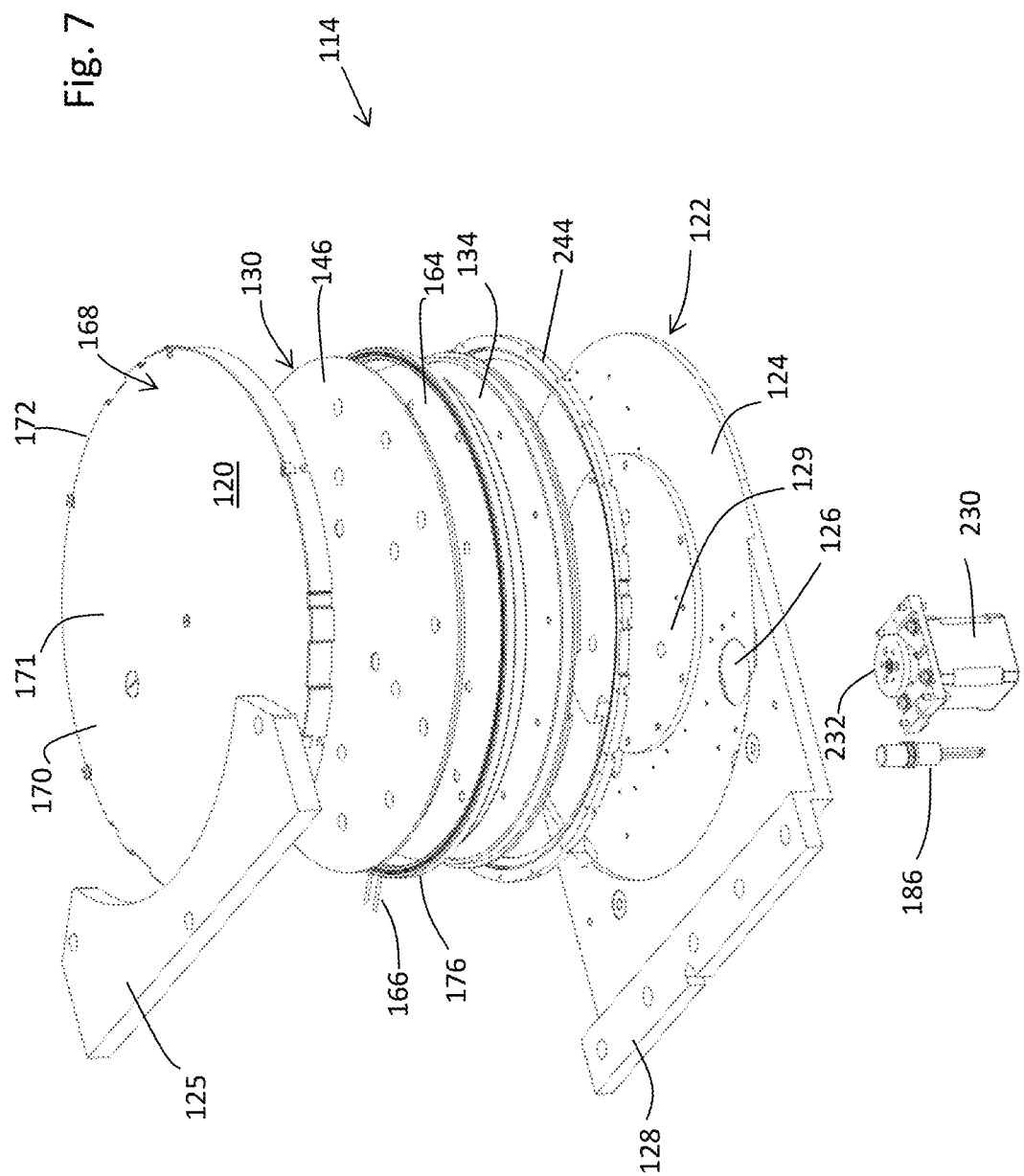
FIG. 7 is an exploded view of the apparatus components shown in FIG. 5.
Figure 8:
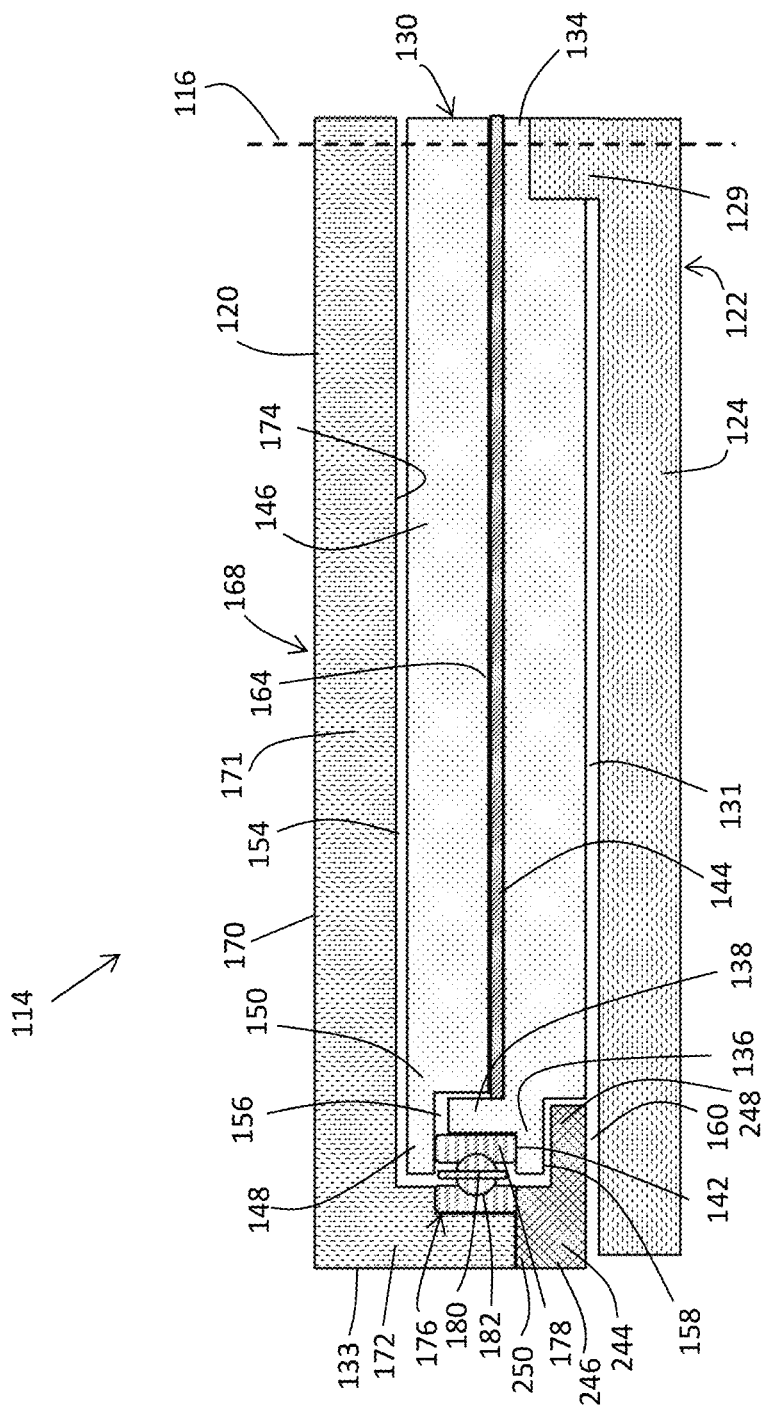
FIG. 8 is a schematic side view taken in cross-section of approximately half of the chuck of FIGS. 1-7, showing components of the first and second chuck portions, a ring bearing interconnecting the first and second chuck portions, and a ring gear used to rotationally drive the second chuck portion independently relative to the first chuck portion.
Figure 9:
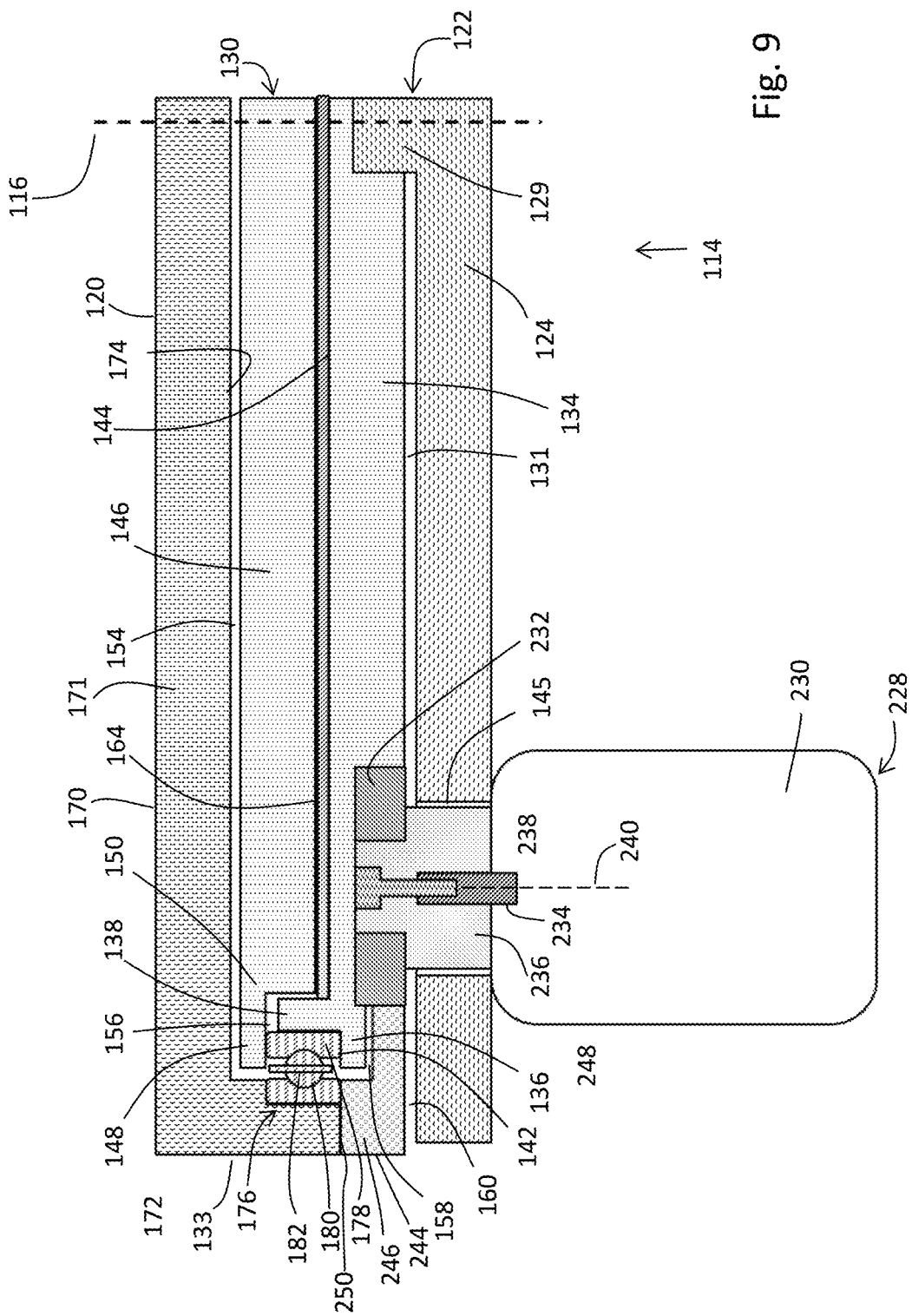
FIG. 9 is a schematic side view taken in cross-section of approximately half of the chuck of FIGS. 1-7, showing components of the first and second chuck portions, a ring bearing interconnecting the first and second chuck portions, and the rotational drive system used to rotationally drive the second chuck portion independently relative to the first chuck portion.

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

Techniques herein include deploying a rotating chuck inside a process chamber such as where a highly contamination sensitive microelectronic substrate is being processed. The principles of the present invention may be used in any microelectronic treatment or fabrication system in which a microelectronic substrate is supported on a rotating chuck during the course of one or more treatments.

In some embodiments, the principles of the present invention are incorporated into chucks that not only rotate but also that translate or traverse through a process chamber. Rotatable and translatable chuck embodiments of the present invention particularly useful in cryogenic cleaning tools such as the ANTARES® cryogenic cleaning tools commercially available from TEL FSI, Inc., Chaska, Minn. These tools implement cleaning treatments have used translatable chucks to scan substrate surfaces through one or more treatment streams. Chucks of the present invention with both translation and rotation capabilities can be retrofit into existing ANTARES® or other tools or incorporated into new tools.

Cryogenic treatments generally involve the practice of generating treatments streams from fluid (gas and/or liquid) feed streams. The feed streams typically are pressurized and optionally cooled. When expanded through one or more suitable nozzles, the pressure release further cools the material. The resultant streams may be in the form of aerosol sprays, gas jet sprays, gas clusters, or the like. The cryogenic treatment stream dislodges contaminants on microelectronic substrate surfaces at least in part by imparting sufficient energy to overcome the adhesive forces between the contaminants and the microelectronic substrate. Hence, producing such treatment streams (e.g., aerosol sprays and/or gas cluster jet sprays in some embodiments) of the right energy may be desirable. The energy of the treatment spray, which correlates to cleaning power, is a function of mass and the velocity. The energy may be increased by increasing velocity or mass. Increasing energy may be important to overcome strong adhesive forces between contaminants and the surface of the substrate, including both larger contaminants and even when the contaminants are smaller (<100 nm).

Chuck embodiments of the present invention incorporate rotational drive mechanisms that may be compact and that may have a small footprint. The compact size and footprint is useful in any systems with rotatable chucks even if translatable chuck capabilities are not needed. Thus, in addition to providing compact systems with rotatable and translatable chucks, the smaller footprint and size of the chuck also can decrease the footprint of a rotating but non-translating chuck. This may be desirable, for example, to reduce manufacturing costs or to reduce the size of the overall tool in which the chuck is used. Further, processing throughput is significantly increased for a facility if a larger amount of chambers are able to be used such as by more chambers being clustered together on a common platform. The additional chambers enable more substrates to be processed at the same time per square foot of facility space to enhance throughput.

Referring to FIGS. 1-16, the principles of the present invention will be illustrated by an apparatus in the form of cryogenic treatment system 100. System 100 may be used to treat microelectronic substrate 102 using a treatment spray 106. Such treatment spray 106 may be in the form of cryogenic aerosols, cryogenic aerosol jets, nano-aerosol sprays, gas jet clusters, and the like in some embodiments. However, the translation and/or rotation system disclosed herein is not intended to be limited to cryogenic treatment equipment, which is done for explanatory purposes only. The translation and/or rotation system may be incorporated into any other systems where a workpiece needs to be rotated during at least a portion of one or more treatments. The system 100 illustrates an exemplary implementation of the present invention within the cryogenic treatment context where temperature, pressure, gas flow rates, and many other process conditions are controlled to treat substrates as a demonstration of the many capabilities of the present invention to meet a variety of demanding performance criteria.

System 100 includes housing 108 that is configured to provide a process chamber 110. The pressure of process chamber 110 is controllable to provide various treatment pressures including a sub-atmospheric pressure environment during at least a portion of a treatment. In representative modes of practice, a vacuum established in process chamber may be in a range from 1 milliTorr to 750 Torr. Often, the pressure is under 35 Torr or even under 10 Torr to enhance the formation of a treatment spray 106 comprising an aerosol and/or gas clusters.

For example, the cryogenic treatment spray may be formed by expanding relatively high pressure and low temperature gas and/or liquid into a sub-atmospheric environment of process chamber 110. In illustrative embodiments, the fluid may be supplied at pressures in the range from 10 psig to 900 psig, preferably 10 psig to 500 psig, more preferably 10 psig to 100 psig. The temperature of the fluid may be in the range from 50 K to 320 K, preferably 70 K to 320 K, more preferably 70 K to 150 K. So long as the fluid stream can flow and be dispensed into the chamber, some modes of practice may involve supplying fluids with entrained solid material. Preferably, the fluid is supplied at pressure and temperatures such that the fluid comprises a gas and/or a liquid.

Treatment spray 106 is dispensed into process chamber 110 through one or more suitable nozzles. For purposes of illustration, a single nozzle 112 is shown. Nozzle 112 receives fluid stream (e.g., a flow of one or more gases and/or one or more liquids) from a fluid supply system comprising fluid supply source 210 coupled to nozzle 112 by feed line 214. Optionally, the fluid supply system may further incorporate a cooling system 212 to further cool the fluid(s) to a desired temperature prior to being expanded through nozzle 112 and dispensed into the process chamber 110. Fluid is supplied from fluid supply 210 to cooling system 212 by line 216. The cooled fluid is supplied from cooling system 212 to feed line 214 via line 218.

Fluid supply source 210 may comprise one or more pressurized and cooled fluids. Such fluids may be gases and/or liquids. Preferably, the pressurized and cooled fluids comprise at least one gas. Examples of suitable gases or liquids include one or more of nitrogen, argon, He, hydrogen, Xe, $CO_2$, neon, krypton, combinations of these, and the like. In one embodiment, the pressurized and cooled gas or liquid is argon. In another embodiment, the pressurized and cooled gas or liquid is nitrogen. In another embodiment, the pressurized and cooled gas or liquid comprises nitrogen and argon at a molar ratio of argon to nitrogen in the range from 1:100 to 100:1, preferably 1:20 to 20:1, more preferably 1:10 to 10:1.

In those embodiments comprising carbon dioxide, nitrogen and/or argon, the fluid may further comprise one or more additional gases or liquids as well. In one embodiment, the additional gas or liquids comprise helium, hydrogen, neon, or a combination of these wherein the molar ratio of the total amount of the additional gas(es) to the argon, carbon dioxide and/or nitrogen is in the range from 1:100 to 100:1, preferably 1:1 to 10:1. Specific mixtures include argon and helium; argon and hydrogen; argon, hydrogen, and helium; nitrogen and helium; nitrogen and hydrogen; nitrogen, hydrogen, and helium; carbon dioxide and helium; carbon dioxide and hydrogen; and carbon dioxide, hydrogen, and helium.

Nozzle 112 is configured to expand and cool the fluid stream as it is dispensed as spray 106 into the process chamber 110 onto substrate 102 below nozzle 112. Substrate 102 is scanned underneath nozzle 112 by translating and/or rotating substrate 102 to help ensure substrate 102 is uniformly treated. The nozzle 112 may be aimed at the upper surface of the chuck 114, and hence substrate 102, at any suitable angle. In one embodiment, the nozzle is disposed to dispense treatment spray 106 normal to the upper surface of chuck 114.

Nozzle 112 may be deployed at any suitable distance relative to the upper surface of substrate 102. In one embodiment, the distance between nozzle 112 and the upper surface of substrate 102 is in the range from 0.5 mm to 200 mm, preferably 0.5 mm to 100 mm, more preferably 0.5 mm to 60 mm, even more preferably 2 mm to 50 mm.

Substrate 102 is held on rotatable and translatable chuck 114 that is disposed in the process chamber 110. Substrate 102 thus is held by the movable chuck 114 while substrate 102 is translated and/or rotated during at least a portion of a treatment. Chuck may include gripping and/or supporting features to help secure substrate 102 on chuck 114. The substrate 102 may be held on chuck 114 using a wide variety of such gripping and/or supporting features such as any of the commonly practiced techniques within the field of semiconductor processing. These may include, but are not limited to, mechanical fasteners or clamps, vacuum clamping, gripping fingers, rest pads, electrostatic clamping, combinations of these, and the like. Illustrative embodiments of substrate holding features are described further below. Further, the chuck 114 may include lift pins, actuation pins, pivot arms, and the like to help transfer the substrate 102 to and from the movable chuck 114 when the substrate 102 enters or is taken from the process chamber 110 manually or automatically via a wafer handling system (not shown). Illustrative embodiments of substrate lifting features are described further below.

Figure 12:
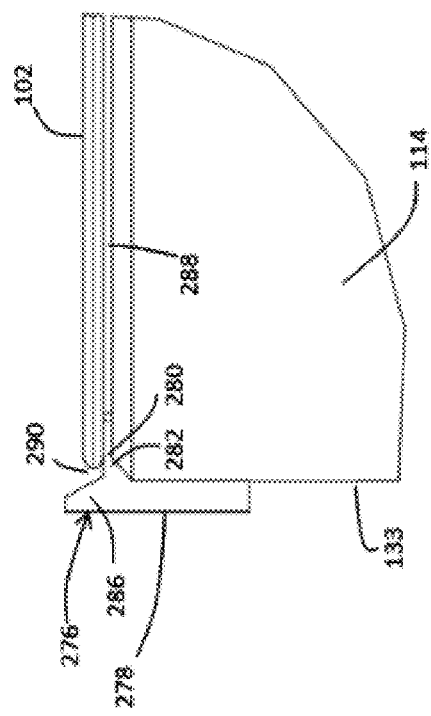
FIG. 12 is a side view of the portion of the chuck shown in FIG. 12.
Figure 11:
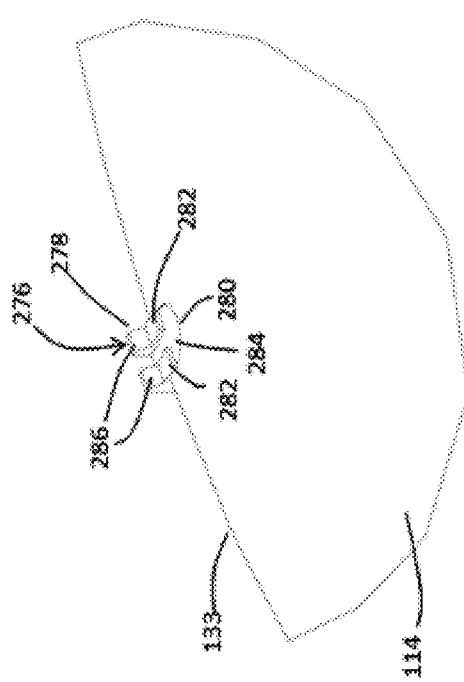
FIG. 11 is an enlarged view in perspective of the portion of the chuck assembly within dashed circle A of FIG. 6.

Substrate 102 is schematically shown in FIG. 1 as directly contacting upper surface 120 of chuck 114. In more preferred modes of practice, as shown in FIG. 12, substrate 102 may be supported so that a small gap 288 is provided between substrate 102 and upper surface 120.

The rotatable and translatable chuck 114 may be translated to traverse laterally along at least one translational degree of freedom 206 to facilitate translational scanning of the substrate 102 underneath the nozzle 112. Further, the translatable and rotatable chuck 114 is configured to rotate the substrate 102 about rotation axis 116 to provide rotational degree of freedom 118. Translation and rotation may be done concurrently or individually to adjust the dwell time of the spray 106 onto all or selected portions of the substrate 102 to adjust cleaning efficiency and throughput without undue risk of damaging features on the substrate 102.

Chuck 114 includes a first chuck portion 122 that serves as a chuck base. First chuck portion 122 is coupled to translation mechanism 188, which is described further below. Chuck 114 also includes second chuck portion 168. The second chuck portion 168 is rotatingly coupled to the first chuck portion 122 so that the second chuck portion 168 independently rotates relative to first chuck portion 122. Second chuck portion 168 holds substrate 102. Consequently, rotation of second chuck portion 168 imparts corresponding rotation to substrate 102.

First chuck portion 122 comprises base plate 124, shelf member 125, and heater assembly 130 attached to base plate 124. Base plate 124 provides a rigid mounting support for the other chuck components. For example, the topside of base plate 124 includes a symmetric pattern of tapped holes to allow attachment of other chuck components. The underside of base plate 124 provides a stable mounting surface for components such as an offset motor that is used to drive rotation of second chuck portion 168. The underside of base plate 124 also is a convenient site to mount sensors such as RTD temperature sensors, home sensors, and the like. Base plate 124 also provides attachment points for connection to translation mechanism 188, components of rotational drive system 228, and one or more optional sensors such as one or more temperature sensors, control and limit monitoring, hall-effect sensors or the like to home the chuck rotational position, and the like. For purposes of illustration, an exemplary sensor 186 is mounted to base plate 124 to be used to validate the rotational position of the spin plate 170 relative to non-rotating components of chuck 114.

Sensor 186 may be an off-shelf Hall Effect type proximity switch that triggers off the field from the south pole of a permanent magnet that is captured in the underside of the ring gear 244. Such a sensor is rated for operation in vacuum at temperatures up to 150 C. Other methods of position detection may be used. In some embodiments, RTD's are suitable temperature measurement sensors. An RTD refers to a resistance temperature detector. Such devices generally contain a resistor that changes resistance value as the temperature changes. RTDs are widely used in laboratory and industrial settings. A suitable RTD is an off-shelf surface-mount type temperature measurement device with an aluminum housing that allows attachment to the underside of the base plate 124. Suitable examples of such an RTD feature 100 Ohm resistance at 0 C, temperature coefficient of 0.00385/C, PFA insulated cable, and are rated up to 230 C.

Base plate 124 includes access port 126 to facilitate coupling chuck 114 to the rotational drive system 228. Cross arm portion 128 helps to provide structural rigidity and to facilitate connection to translation mechanism 188. The space between end 128 and the chuck 114 is filled with shelf member 125 to provide a smooth surface that is level with substrate 102. This promotes favorable flow of treatment materials from substrate 102 during a treatment. Central hub portion 129 facilitates connecting base plate 124 to heater assembly 130. Heater assembly 130 is fixed to base plate 124 so that heater assembly 130 and base plate 124 translate together along pathway 206, but neither rotates around rotation axis 116. Thus, both base plate 124 and heater assembly 130 are stationary with respect to rotating second portion 168. In one illustrative embodiment, base plate 124 is fabricated from aluminum, such as machined 6061-T6 aluminum.

Gap 131 between heater assembly 130 and base plate 124 results when heater assembly 130 is connected to center hub portion 129. This provides a clearance so that first chuck portion 122 and second chuck portion do not contact each other at the spaced apart interface at gap 131 when second chuck portion 168 rotates independently relative to first chuck portion 122.

Heater assembly 130 generally includes a lower plate 134, upper plate 146, heater film 164, and electric leads 166 to facilitate coupling sources of power and control processing to the heater assembly 130. Lower plate 134 is attached to central hub 129 and cantilevers outward from that central region toward the periphery 133 of chuck 114. Lower plate 134 is generally circular in shape. Overhang flange 136 and wall 138 at the outer periphery define shoulder 142, bottom recess, and recessed floor 144. Shoulder 142 provides a space for coupling ring bearing 176 (described further below) to heater assembly 130. Bottom recess 140 provides relief for ring gear 244 (described further below). The inside of lower plate 134 is recessed to accept heater film 164, which fits onto recessed floor 144. Lower plate 134 includes chamber 145 for rotatably housing components or rotational drive mechanism, described further below. Chamber 145 is offset toward the outer periphery of lower plate 134. Lower plate 134 is desirably constructed from aluminum, such as 6061-T6 aluminum.

Upper plate 146 is secured to lower plate 134 by a suitable coupling strategy. Any suitable fastener(s) may be used to removably attach upper plate 146 to lower plate 134. Upper plate 146 is generally configured to mate with lower plate 134 in a way to securely sandwich and clamp heater film 164 between upper plate 146 and lower plate 134. Upper plate 146 is generally circular in shape and includes projecting flange 148 at its outer periphery 150. Flange 148 overhangs shoulder 142 in a manner effective to define a pocket for clamping ring bearing 176 between upper plate 146 and lower plate 134. Gap 156 between flange 148 and wall 138 provides clearance to ensure strong clamping of the ring bearing 176. Upper plate 146 is desirably constructed from aluminum, such as 6061-T6 aluminum.

Heater film 164 may be any suitable thin film heating mechanism. In one embodiment, a heater assembly embodiment may be capable of being heated to a desired treatment temperature such as a temperature ranging from 25 C to 300 C. In another embodiment, a suitable temperature range is 25 C to 150 C, preferably 30 C to 120 C, more preferably 40 C to 110 C.

In one exemplary embodiment, heater film has a Kapton-style thin film composite construction that is 0.007 inches thick and 10.75 inches in diameter with a heating power of 1.5 kW. This embodiment may operate with 208V single phase power and could be rated for a suitable maximum temperature, such as a temperature up to 200 C. In one illustrative treatment recipe, this embodiment is operated at a nominal heater temperature of 105 C.

Heater assembly 130 is actuated to deliver heat to substrate 102 held on chuck 114 during all or a portion of a treatment. Heating substrate 102 provides many useful functions. According to one function, heating helps to improve the efficacy of treatment media dispensed onto substrate 102 from nozzle 112. For instance, some cleaning media may be more selective to achieve a desired result when heater assembly 130 is maintained in a particular temperature range. In some cleaning treatments such as cryogenic treatments, heating also may be important to prevent dislodged particles from re-depositing onto wafer (thermophoresis effects). The heating system may be used to improve temperature non-uniformity across the substrate 102 and minimize temperature-induced stress based on the temperature difference between the treatment spray 104 and process chamber conditions. For example, in the absence of heating, using a cold treatment fluid could cause the substrate to physically distort. Heating helps to maintain a uniform substrate temperature to avoid undue distortion. Heating also helps to prevent dislodged particles from re-depositing onto a cleaned substrate surface. Heating may decrease the likelihood of condensation on the moveable chuck 112 or substrate 102 due to dramatic temperature changes during substrate treatments.

It may be difficult from a practical perspective to directly monitor the temperature of the substrate 102 itself during treatments. In contrast, temperature sensors may be more easily deployed to accurately measure and control the temperature of the underside of base plate. Due to the somewhat remote location of these sensors from the substrate 102, the actual steady state temperature reached on substrate 102 is lower than the control temperature on the underside of baseplate 124. For example, in the case of a 105 C control temp at underside of baseplate 124, the "on-wafer" temperature measured using a SenseArray wafer was between 85 C to 90 C in one embodiment. Thus, there is an offset between a desired control temperature "on-wafer" and the heater control temperature. This offset desirable is taken into account to achieve the desired "on-wafer" temperature and can be determined empirically for a given tool and process recipe. Sensing and controlling the temperature at the underside of base plate 124 is effective, as this temperature tends to accurately correlate to the substrate temperature.

The second chuck portion 168 is rotatingly coupled to the first chuck portion 122 so that the second chuck portion 168 independently rotates around rotation axis 116 relative to first chuck portion 122. Second chuck portion 168 holds substrate 102. Consequently, rotation of second chuck portion 168 imparts corresponding rotation to substrate 102.

Second chuck portion 168 generally includes spin plate 170 and substrate holding features (described further below) incorporated into second chuck portion 168. Spin plate 170 includes panel 171 and rim 172 at the outer periphery of panel 171. Rim 172 includes recess 174 on its interior to provide a place for holding ring bearing 176. Heater assembly 130 fits inside spin plate 170. Gap 154 between spin plate 170 and heater assembly 130 avoids sliding contact between these two components when spin plate 170 rotates. In an illustrative embodiment, spin plate 170 is fabricated from aluminum such as 6061-T6 aluminum. Spin plate 170 is rotatingly driven by rotational drive system 228, described further below.

Second chuck portion 168 is rotatingly coupled to first chuck portion 122 by ring bearing 176 in a manners such that spin plate 170 is rotatingly suspended above and out of contact with heater assembly 130 and base plate 124. Ring bearing 176 includes inner race 178, outer race 180, balls 182, and retainer 184. Inner race 178 is clamped into heater assembly 130 between overhang flange 136 on lower plate 134 and flange 148 and upper plate 146. Outer race 180 is clamped between spin plate 170 of second chuck portion and ring gear 244 of rotational drive mechanism 228. In this configuration, inner race 178 is fixed with respect to first chuck portion 122 while outer race 180 is fixed with respect to second chuck portion 168. Ring bearing 176 thus provides a rotatable interface that allows spin plate 170 to rotate about rotation axis 116 independently of first chuck portion 122. Gap 158 between lower plate 134 and ring gear 244 allows rotation to occur without contact between heater assembly 130 and ring gear 244. Gap 160 between ring gear 244 and base plate 124 allows rotation to occur without contact between ring gear 244 and base plate 124. Ring bearing 176 allows minimal rotating gap between rotating and non-rotating chuck components for effective heat transfer between spin plate 170 and heater assembly 130.

In one illustrative embodiment, ring bearing 176 has a thin section, rotary cage-less design that uses low-outgassing grease for lubrication. The ring bearing 176 may be constructed from 440C stainless steel. The ring bearing 176 may use silicon nitride load balls and Torlon (PAI) 4203 L spacer balls in place of a cage. Ring bearing 176 may use a 4-point radial contact design and use 10% fill of low-outgassing grease (Nyetorr 5300xp).

Rotational drive system 228 is incorporated into chuck 114 and, hence, translates with chuck 114 as chuck is translated through process chamber 110. Rotational drive system 228 is incorporated into chuck 114 in a manner effective to rotate the second chuck portion 168 independently relative to first chuck portion 122. Rotational drive system 228 causes second chuck portion 168, and hence substrate 102, to rotate around rotation axis 116. Rotational drive system 228 can be actuated to cause rotation in either direction, e.g., either clockwise or counterclockwise rotation as desired.

Rotational drive system 228 generally includes motor 230, drive gear 232, shaft 234, adaptor 236, and ring gear 244. Motor 230 is attached to the underside of base plate 124 in a manner to provide rotational drive axis 240 that is radially offset from centrally located rotation axis 116 outward toward the periphery of chuck 114. Thus, motor 230 provides rotational driving force on axis 240 that is parallel to, but spaced apart from rotation axis 116. This close proximity to the ring gear 244 allows a smaller motor to apply a desired level of rotational power to the ring gear 244 as compared to a more centrally located motor that would need to be larger to apply the same driving power from a more central location with respect to ring gear 244. In practical effect, more torque is available from a given size motor by driving the ring gear 244 from the radially offset location rather than from its center. For example, with a 10:1 gear reduction, for example, the amount of load that may be driven was increased by 10× at ⅒ the rotary speed of the motor shaft. In one mode of practice, the spur gear set comprises a small 12 tooth drive gear 232 and a larger 120 tooth driven ring gear 244. The ability to impart significant torque to ring gear 244 from a relatively small motor provides a significant advantage.

As another advantage, this approach allows motor 230 to be small enough to easily fit inside chamber 110 without obstruction or collision with other chamber features as chuck 114 translates back and forth. Fitting a more centrally located and/or larger motor would be more difficult to fit into a process chamber due to potential obstructions or other interference. An additional benefit of an offset motor was that its frame size (directly related to its output power) could be more easily held within a smaller spatial envelope by virtue of a gear reduction. While this reduction may be achieved with a belt and pulley set or the like, using a gear set promotes rolling contact and thus helps to keep materials from rubbing and generating particles. Low-outgassing vacuum-rated grease applied to gear teeth was an added enhancement to support low friction and minimize wear and particle generation. With a 10:1 gear reduction, for example, the amount of load that may be driven was increased by 10× at ⅒ the rotary speed of the motor shaft. In one mode of practice, the spur gear set comprises a small 12 tooth drive gear 232 and a larger 120 tooth driven ring gear 244.

Motor 230 is rotationally coupled to drive gear 232 by motor shaft 234, Adaptor 236 is used to couple shaft 234 to the drive gear 232. Cap screw 238 secures shaft 234 to the adaptor 236. Motor 230 can be actuated to rotate drive gear 232 in either a clockwise or counter clockwise direction. In the present specification, the direction of rotation, either clockwise or counterclockwise, is with respect to a top view of apparatus 100 looking down onto the rotating component. Motor 230 may be lubricated with similar, low outgassing lubricants as are used with respect to ring bearing 176.

An exemplary embodiment of motor 230 provides 0.235 Nm at 600 rpm (1.0 amp at 67 VDC). With a 10:1 gear reduction as might be practiced in an illustrative embodiment, this would confer up to 2.35 Nm at 60 rpm spin plate speed. Such an embodiment could be rated to 175 C in a vacuum environment. Such an embodiment could involve 1.8 degrees per steps, 200 steps per revolution. Prior to first use, such a motor could be pre-baked for 24 hours at 150 C to 200 C to help outgas volatile materials.

Drive gear 232 is rotatably driven by motor 230 about drive rotation axis 240. Drive gear 232 is rotatably housed in chamber 145 provided on the lower side of lower plate 134 of heater assembly 130. With motor 230 mounted to the underside of base plate 124, motor shaft 234 and adaptor 236 fit through aperture 126 in base plate 124 in order to position drive gear 232 in chamber 145. In an illustrative embodiment, drive gear 232 is made from PEEK (polyether ether ketone) and features 12× external teeth on a diameter of 1.359 inches. To provide a compact drive configuration with respect to such an embodiment, drive gear 132 may be 0.165 inches thick.

Drive gear 232 engages ring gear 244. An outer region 246 of ring gear 244 is mounted to the underside of rim 172 of spin plate 170. Hence, when ring gear 244 is driven by drive gear 232, corresponding rotation is imparted to spin plate 170 as well. While drive gear 232 rotates about offset drive rotation axis 240, ring gear 244 is rotated around centrally located axis 116. A top surface 250 of ring gear 244 helps to provide clamping action to hold outer race 180 of ring bearing 176 in place. Inner region 248 of ring gear 244 comprises gear teeth on the inner wall to engage with drive gear 232. Desirably, the teeth of drive gear 232 are slightly wider than the teeth of ring gear 244 in order to accommodate vertical stack tolerances.

In one illustrative embodiment, ring gear 244 is made from PEEK and features 120× internal teeth that are 0.125 inches thick on an outside diameter of 11.845 inches. As part of a gear set with the illustrative embodiment of drive gear 232 described above, this provides a gear ratio of 10:1 on an operating center distance of 4.900 inches. At an illustrative operating temperature of 105 C, the PEEK material of the gears will safely handle a static torque that is about 20× greater than that needed to overcome total turning resistance, primarily due to bearing friction. The gear teeth desirably are lubricated with a light coating of low-outgassing grease such as that used for ring bearing 176.

In one mode of practice, the chuck 114 is translated under the nozzle 112 in one or several passes at a rate up to 300 mm/sec using a preset motion profile that enables uniform coverage of nozzle spray 106 to all substrate areas. As the chuck 114 is translated in this embodiment, it may be rotated at a rate up to 120 RPM. Heating of the substrate by maintaining heater assembly 130 at a temperature of up to 105 C allows for particle removal with minimal re-deposition.

In operation, motor 230 rotationally drives shaft 234 in the desired speed and direction. Shaft 234 in turn rotates drive gear 232 about drive rotation axis 240. This can be done continuously or intermittently during the course of a treatment. The rotation speed can be maintained or varied according to a desired speed profile. Rotation can occur clockwise and/or counterclockwise. Drive gear 232 meshes with ring gear 244, causing ring gear 244 to rotate about centrally located rotation axis 116. With ring gear attached to spin plate 170, this imparts corresponding rotation about rotation axis 116 to spin plate 170. With spin plate 170 coupled to the first chuck portion 122 by the rotational interface provided by ring bearing 176, the assembly of ring gear 244 and spin plate 170 rotates independently of first chuck portion 122.

Rotatable and translatable chuck 114 is attached to translation mechanism 188. Translation mechanism 188 is coupled to the chuck 114 in a manner effective to translate the moveable chuck 114 along a pathway 206 underneath the nozzle 112, to allow the microelectronic substrate 102 to be moved through the treatment spray 106 dispensed from the nozzle 112. In practical effect, translation of chuck 114 helps nozzle 112 scan across substrate 102 optionally as substrate 102 rotates. Translation can be distinguished from rotation in that translation of chuck 114 causes the rotation axis 116 of chuck 114 to move from one location in chamber 110 to another location. In rotation, the relative position between rotation axis 116 and chuck 114 does not change even as chuck 114, and hence translation axis 116, translates within chamber 110.

Translation mechanism 188 includes support arms 192, translation rods 194, leveling mechanism 200, and translation drive system 202. Base plate 124 of chuck 114 is attached to translation mechanism. Consequently, actuation of translation mechanism 188 causes corresponding translation of chuck 114. An end 128 of base plate 128 is coupled to the tops of support arms 192 such that base plate 124 cantilevers outward from support arms 192. Leveling mechanism 200 can be used to adjust the leveling of base plate 124 as desired.

The base of each support arm 192 is connected to a corresponding translation rod 194 whose first ends 196 are connected to the support arms 192 and whose second ends 198 are coupled to a translation drive system 202. Portions of translation rods 194 include portions outside process chamber 110. Successive portions of rods 194 enter or leave the protected enclosure (which often is a vacuum enclosure in the case of cryogenic treatments) provided by chamber 110 as the rods 194 are actuated to translate back and forth. A seal interface provides an environmentally tight seal at the housing egress 204 for rods 192 to help maintain the the protected environment, e.g., vacuum, inside chamber 110 during this translation.

The translation drive system 202 may comprise any electrical, mechanical, electromechanical, hydraulic, or pneumatic device to allow actuation of rods 192. The translation drive system 202 may be designed to provide a range of motion sufficient to permit desired translation of the microelectronic substrate 102 to facility loading, unloading, and treatment operations. For example, during at treatment, substrate 102 is scanned at least partly through the area of treatment spray 106 emanating from the nozzle 112. During treatments, the substrate 102 can be translated underneath the nozzle 112 across a portion or the entire diameter of the substrate 102 at a suitable rate, such as up to 300 mm/sec, such that the nozzle 112 scans the desired portions of the substrate 102. In many embodiments, the treatment spray 106 is practiced to treat the entire surface of the substrate 102. In conjunction with the translational movement of chuck 114, the substrate 102 rotates to assist with full surface treatment.

Treatment materials dispensed into chamber 110 may be evacuated using vacuum system 208. Vacuum system 208 also may be used to establish and to maintain processing chamber 110 at an appropriate sub-atmospheric, process pressure. The vacuum system 208 may include one or more pumps to enable vacuum pressures to a desired level.

A control system 220 (which may include one or more integrated control devices) may be used to monitor, receive, and/or store process information. For example, control system 220 may include a memory 222 to store process recipes, command structures, user interfaces, real time process information, historical process information, feed supply, temperature control, pressure control, heating control, chuck levitation and rotation, chuck translation, substrate loading and unloading, substrate securement on the chuck 114, process control feedback, and the like. Control system 220 may use a computer processor 224 to implement these operations and to receive and issue instructions and other signals over a network 226 that interfaces with the other components of system 100. For example, the control system 220 may control the heater assembly 130 to adjust the temperature of the substrate 102 for purposes such as to minimize thermal distortion and/or prevent condensation on the substrate 102 or on the chuck 114.

Substrate holding system 276 is used to help hold substrate 102 on the chuck 114. Substrate holding system generally includes stationary retention members 278 and active retention members 292. In an illustrative embodiment, chuck 114 includes three or more active retention members evenly spaced around the perimeter of chuck 114. Each stationary retention member 278 includes a pad 280 comprising a raised portion 282 and a lower portion 284. Integral, sloped backs 286 project upward from the pad 280. In use, the outer periphery of substrate 102 is supported on raised portion 282 of pad 280 such that gap 288 is provided between substrate 102 and the upper surface 120 of chuck 114. This limits contact to just those areas of the backside of substrate 102 resting on raised portions 282 to minimize backside contact against substrate 102. Sloped backs 286 provide integral outside barriers to laterally restrain substrate 102. The backs 286 are sloped to serve as guides to help ensure proper loading and unloading of substrate 102 from chuck 114 using lift pin system 252.

A gap 290 may exist between backs 286 and the substrate 102 to avoid further areas of substrate contact. Generally, the passive restraint system of stationary retention members 278 provides excellent retention for substrate 102 to in many different kinds of treatments. For example, in some treatments in which treatment spray 106 is dispensed onto substrate 102 at flow rates below about 180 standard liters per minute (SLM) while spin plate 107 rotates around rotation axis 116 at speeds under about 60 rpm, substrate 102 tends to be contained and stable within these barriers. However, at higher flow rates and/or higher rotational speeds, substrate 102 may have a tendency to vertically lift. Active retention members 292 are provided to help prevent such vertical lift. Thermal differential in the substrate 102 (such as might result from a cryogenic dispense of treatment material onto the substrate 102) also may cause retention issues. With a sufficient temperature differential between the substrate edge and center, for example, a substrate could warp. In a warped condition, the substrate might no longer be radially constrained by the stationary retention members 278. A warped substrate could leave chuck 114 sideways. The active retention members 292 also help retain a warped substrate 102 under such conditions.

Active retention members 292 include a pivot arm 294 that pivots around pivot axis 296. Pivot axis 296 in some embodiments is generally orthogonal to upper surface 120 of chuck 114, and hence orthogonal to the main plane of substrate 102. First end 298 of pivot arm 294 is configured with a cam roller 302 that spins freely. Second end 300 of pivot arm 294 is configured with a retainer head 304 having a projecting extension that overhangs the outer edge of substrate 102 to help prevent vertical lift. For a compact profile, pivot arms 294 are contained within the thickness of the spin-plate 170 of the chuck 114.

Pivot arm 294 can pivot about pivot axis 296 to be in a substrate retaining, or closed, position in which retainer head 304 overhangs substrate 102. Alternatively, pivot arm 296 can be actuated to pivot to an open configuration to allow a substrate 102 to be placed onto chuck 114 or released and removed from chuck 114. In illustrative embodiments, pivot arm 294 is biased to default to a closed, or substrate retaining position. Actuation overcomes this bias to open access to and from chuck 114 for substrate loading and unloading. One embodiment of an actuation strategy to open and close active retention members 292 is incorporated into lift pin system 252.

Lift pin system 252 is used to lift and lower substrate 102 onto or from chuck 114. Additionally, lift pin system 252 includes capabilities to coordinate lifting and lowering of substrate 102 with actuation of active retention members 292. This coordinated actuation allows those members 292 to be automatically open and closed during lifting and lowering actions.

Lift pin system 252 generally includes actuation drive 254, shaft 256, coupler 258, yoke 260, lift pins 268, actuation pins 270, and pressure differential 274. Actuation drive 254 is coupled to shaft 256 and is configured to raise and lower shaft 256 on demand. In this embodiment, shaft 256 moves up and down but is rotationally fixed. Shaft 256 also is coupled to lift pin yoke 260 by coupler 258. Accordingly, up and down actuation of shaft 256 is imparted to yoke 260. Typically, drive 254 is outside process chamber 110, yoke 260 and components supported on yoke 260 are inside process chamber 110, and shaft 256 is partially inside and partially outside process chamber 110. The portion of shaft 256 inside chamber 110 depends on the degree to which shaft 256 is raised or lowered. A suitable seal is provided at the interface where shaft 256 passes through housing 108 in order to help maintain the desired conditions inside chamber 110. Differential 274 is a vacuum port between two seals on the lifting shaft 256 that helps to maintain a differential seal as shaft 256 is actuated up and down. For example, differential 274 may be connected into a foreline exhaust to achieve a differential seal at a sliding shaft pass through. Differential 274 may be maintained at a pressure lower than the chamber pressure so that a leak or contamination generated from shaft actuation is carried away from chamber 110 for cleanliness.

Yoke 260 includes a central region 261 that is coupled to shaft 256 by coupler 258. Arms 262 extend outward from central region 261. Inner ends 264 of arms 262 are coupled to central region 261. Outer ends 266 of arms 262 support lift pins 268 and actuation pins 270. Action pins include beveled top ends 272. Being coupled to shaft 256 via intermediate components, actuation of shaft 256 up and down imparts corresponding up and down motion to lift pins 268 and actuation pins 270.

In a first mode of operation, lift pin system 252 is in a lowered configuration. In this configuration, both lift pins 268 and actuation pins 270 are below the plane of the upper surface 120 of chuck 114. This configuration is useful when substrate 102 is held on chuck 114. The lowered configuration helps to keep the lift pin system 252 from interfering with a process treatment. The lowered configuration also may be used to park lift pin system 252 when chamber 110 is empty and not being used for a treatment.

In a second mode of operation, lift pin system 252 is in a raised configuration. In this configuration, lift pins 268 and actuation pins 270 are raised above the upper surface 120 of chuck 114. In this configuration, lift pins 268 may have lifted substrate 102 off of chuck 114. From such a raised position, the substrate 102 may be removed from chamber 110 by a suitable handling mechanism. Alternatively, lift pins 268 may be raised and ready to receive a substrate into chamber 110.

In a third mode of operation, lift pin system 252 may be in transit between raised or lowered positions. Lowering is useful to help transfer a substrate onto chuck 114 or to park lift pin system 252. Raising is useful to help transfer a substrate off of chuck 114 or to raise the lift pins 268, if empty, to receive a new substrate.

The function of actuation pins 270 is best seen in FIGS. 13 to 16. Raising and lowering of actuation pins 270 is coordinated with the raising and lowering of lift pins 268 so that active retention members 292 can be open to allow substrates to be moved to and from chuck 114 or closed to help retain a substrate on chuck 114. The open configuration is useful when lift pins 268 are in a raised configuration or a transition configuration. The closed configuration is useful when lift pins 268 are in a lowered configuration.

When actuation pins 270 are lowered, pivot arms 294 are biased to hold active retention members 292 in a closed configuration. In illustrative modes of practice, the pivot arms 294 are biased to a hard-stopped, overhung, closed position (that does not contact the substrate edge in some modes of practice) by one or more compression springs acting on the pivot arm 294. When lift pin system 252 is raised, actuation pins 272 also are raised and travel along a vertical path that corresponds with a cam roller location at the edge of the chuck. 114. As actuation pins 270 are raised, beveled or conical top ends 272 are brought into engagement with corresponding cam rollers 302. In this way, the bias of the compression spring is opposed by the rolling action of actuation pins against the cam rollers 302. As the actuation pins 270 are raised further, actuation pins 272 push further against pivot arms 294. The rolling action of cam rollers 302 helps to reduce friction and the risk of debris generation that could result by a more pure sliding engagement. As actuation pins push against second ends 300, pivot arms 294 pivot around pivot axis 296. This action causes first ends 298 to pivot away from the chuck to the open configuration. This causes the retaining head 304 on the opposing side of the pivot arm 294 to be pushed outward. Thus, the substrate 102 is freed to allow the lift pins 270 to lift it. In other words, raising actuation pins 270 opens active retention members 292 by pushing inward against first ends 298 of pivot arms 294.

Lowering of the lift pin system 252 lowers the actuation pins 272 and removes contact of the actuation pins 272 with the cam rollers 302. The first ends 298 pivot outward and return members 292 to the closed configuration in which retainer heads 304 overhang the edge of a seated substrate 102. Lowering actuation pins 272 allows Using the yoke 260 as a lifting platform for both the lift pins 270 and the actuation pins 272 significantly reduces the complexity of apparatus 100, reducing costs, tool footprint, and contamination risks.

Figure 17:
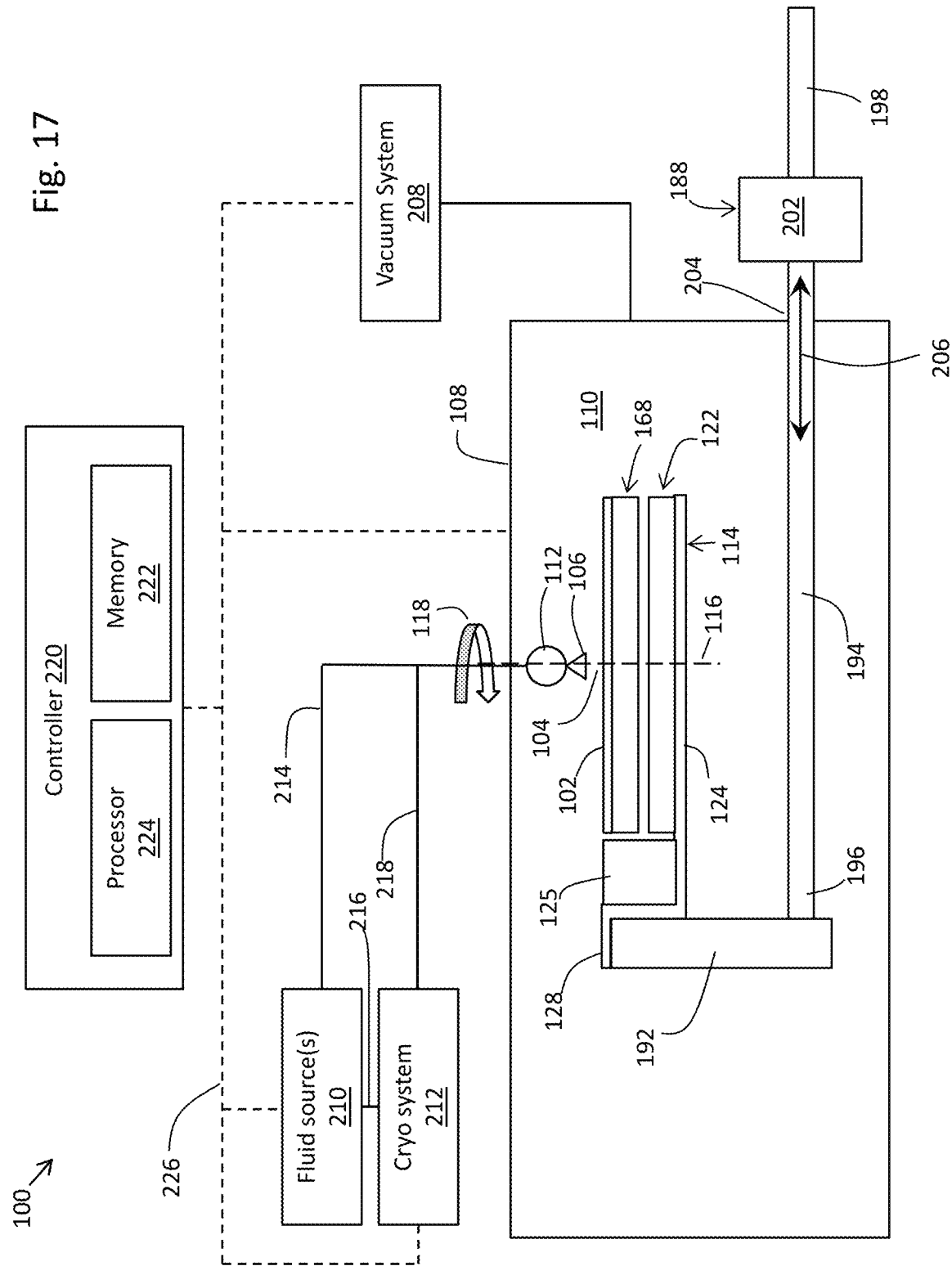
FIG. 17 shows a second configuration of the apparatus of FIG. 1, wherein translation of the chuck has occurred to cause relative movement between the chuck and the nozzle such that the nozzle has scanned across the substrate from the edge to the center of the substrate relative to FIG. 1.

FIG. 1 schematically illustrates a first configuration of system 100 in which second chuck portion 168 is rotating relative to a first check portion 122 about a rotation axis 116 while the translation mechanism 188 translates the chuck 114 along a translation path 206. In this first configuration, chuck 114 is positioned with the nozzle 112 proximal to an edge of the substrate 102 to begin a treatment. This position also is a suitable end a treatment after the nozzle 112 has finished scanning across the substrate 102 due to translation and rotation of substrate 102. In contrast to this first configuration, FIG. 17 shows a second configuration of the apparatus 100 wherein translation of chuck 114 further along pathway 206 has caused relative movement between the nozzle 112 and chuck 114 such that nozzle 112 now has scanned across substrate 102 from the edge to the center 104.

Figure 18:
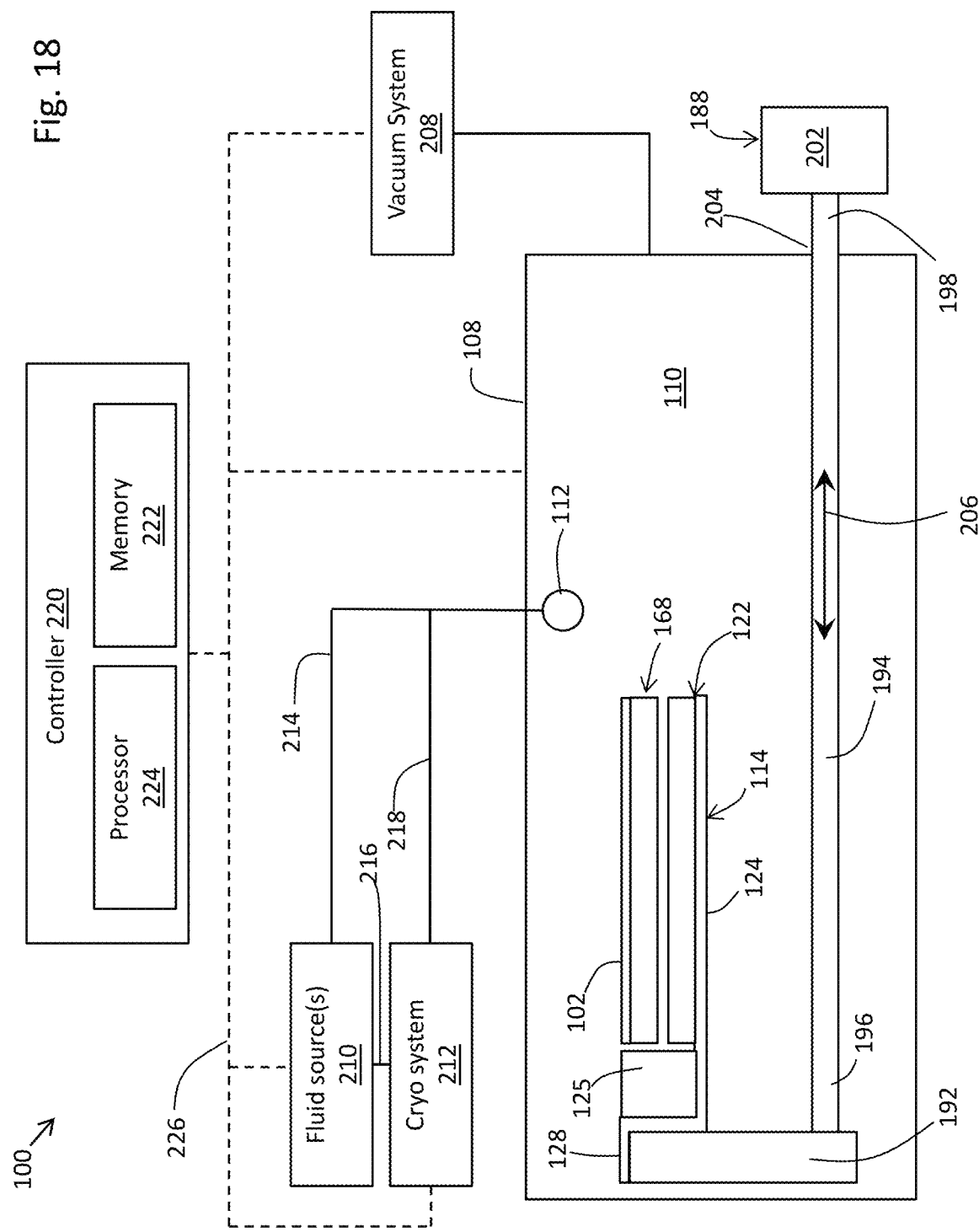
FIG. 18 shows a third configuration of the apparatus of FIG. 1 in which the second chuck portion is not rotating relative to the first chuck portion and the chuck has been translated to a position in the process chamber so that the nozzle is distal from the substrate as might occur before or after a treatment or when the substrate is loaded into or taken from the process chamber.

FIG. 18 shows a third configuration of apparatus 100 of FIG. 1 in which the second chuck portion 168 is not rotating and such that chuck 114 has been translated to a position in the process chamber 110 so that the nozzle 112 is distal from the substrate 102 as might occur before or after a treatment or when the substrate 102 is loaded into or taken from the process chamber 110.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" or "substrate" as used herein generically refers to an object or workpiece being processed in a treatment apparatus such as an apparatus in accordance with the invention, wherein such object or workpiece is intended to constitute all or a portion of a microelectronic device. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

In the aforementioned description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

The invention claimed is:

1. An apparatus for treating a microelectronic substrate, comprising
   a) a housing configured to provide a processing chamber in which the microelectronic substrate is subjected to a treatment;
   b) a rotatable and laterally translatable chuck disposed within the processing chamber, wherein the chuck comprises a first chuck portion and a second chuck portion, wherein the second chuck portion rotates independently of the first chuck portion around a central rotation axis, and wherein the second chuck portion holds the microelectronic substrate during at least a portion of the treatment;
   c) a rotational mechanism interconnecting the first and second chuck portions;
   d) a translation mechanism coupled to the chuck in a manner effective to translate the chuck along a pathway to traverse laterally within the process chamber to scan the microelectronic substrate through one or more treatment streams, wherein the first chuck portion is coupled to the translation mechanism; and
   e) a rotational drive mechanism incorporated into the chuck in a manner effective to cause rotation of the second chuck portion relative to the first chuck portion, wherein said rotation occurs around the central rotation axis, wherein the rotational drive mechanism translates with the rotatable and translatable chuck as the chuck is translated through the processing chamber and wherein said rotational drive mechanism comprises:
      i) a motor attached to the first chuck portion in a manner to provide a rotational drive axis that is radially offset from the central rotation axis;
      ii) a drive gear that is housed inside the rotatable and translatable chuck, that is rotationally coupled to the motor, and that rotates about the rotational drive axis, and
      iii) a ring gear attached to the second chuck portion, wherein the drive gear engages an inner periphery of the ring gear to rotatably drive the ring gear to impart rotation to the second chuck portion such that a rotation interface between the drive gear and the ring gear is shielded inside the rotatable and translatable chuck,
   wherein the apparatus further comprises a nozzle that dispenses a treatment medium onto the substrate, the nozzle configured to be connected to a fluid supply comprising a pressurized and cooled fluid.

2. The apparatus of claim 1, wherein the apparatus further comprises a fluid supply connected to the nozzle, said fluid supply comprising a pressurized and cooled fluid.

3. The apparatus of claim 2, wherein the process chamber is under a vacuum.

4. The apparatus of claim 2, wherein the process chamber is under a pressure in the range from 1 milliTorr to under 10 Torr.

5. The apparatus of claim 2, wherein the nozzle is deployed at a distance from 0.5 mm to 60 mm from an upper surface of the substrate during a treatment.

6. The apparatus of claim 2, wherein the pressurized and cooled fluid supplied to the nozzle is at a temperature in the range from 70 K to 150 K and a pressure in the range from 10 psig to 100 psig.

7. The apparatus of claim 2, wherein the pressurized and cooled fluid comprises at least one of argon, nitrogen, and carbon dioxide.

8. The apparatus of claim 7, wherein the pressurized and cooled fluid further comprises at least one of helium and hydrogen.

9. The apparatus of claim 1, wherein the substrate is supported on the chuck so that a gap is provided between the substrate and an upper surface of the chuck.

10. The apparatus of claim 1, wherein the first chuck portion comprises a base plate connected to the translation mechanism.

11. The apparatus of claim 10, wherein the base plate comprises aluminum.

12. The apparatus of claim 10, wherein the first chuck portion further comprises a heater assembly fixed to the base plate.

13. The apparatus of claim 12, wherein the heater assembly comprises a lower plate, and upper plate, and a heater film positioned between the upper plate and lower plate.

14. The apparatus of claim 13, wherein each of the upper plate and lower plate comprises aluminum.

15. The apparatus of claim 13, wherein the lower plate is attached to a central hub of the base plate in a manner such that the heater assembly cantilevers radially outward from the central hub toward an outer periphery of the chuck.

16. The apparatus of claim 13, wherein the lower plate comprises a chamber that houses the drive gear.

17. The apparatus of claim 13, further comprising a temperature sensor coupled to the base plate, wherein a temperature sensed by the temperature sensor is indicative of a temperature of the substrate.

18. The apparatus of claim 13, wherein the rotational mechanism comprises a ring bearing comprising an inner race connected to the first chuck portion and an outer race connected to the second chuck portion, and wherein the inner race is clamped between the upper plate and lower plate of the heater assembly.

19. The apparatus of claim 10, wherein the rotational drive mechanism further comprises an offset motor connected to the base plate in a manner effective to rotationally drive the drive gear around the offset drive gear axis.

20. The apparatus of claim 1, wherein the first chuck portion comprises heater functionality that delivers heat to a substrate held on the second chuck portion.

21. The apparatus of claim 1, wherein the second chuck portion comprises a spin plate on which the substrate is held such that rotation of the spin plate about the central rotation axis is imparted to the substrate.

22. The apparatus of claim 21, wherein the spin plate comprises aluminum.

23. The apparatus of claim 21, wherein the rotational mechanism comprises a ring bearing comprising an inner race connected to the first chuck portion and an outer race connected to the second chuck portion, and wherein the outer race is clamped between the spin plate and the ring gear.

24. The apparatus of claim 21, wherein the ring gear is connected to an outer periphery of the spin plate.

25. The apparatus of claim 1, wherein the rotational mechanism comprises a ring bearing.

26. The apparatus of claim 25, wherein the ring bearing comprises an inner race connected to the first chuck portion and an outer race connected to the second chuck portion.

27. The apparatus of claim 1, wherein the drive gear comprises drive gear teeth and the ring gear comprises ring gear teeth, and wherein the drive gear teeth are wider than the ring gear teeth.

28. The apparatus of claim 1, wherein the drive gear comprises PEEK.

29. The apparatus of claim 1, wherein the ring gear comprises PEEK.

30. The apparatus of claim 1, wherein an inner region of the ring gear engages the drive gear.

* * * * *